US012628611B2

(12) United States Patent
Shimamura et al.

(10) Patent No.: US 12,628,611 B2
(45) Date of Patent: May 12, 2026

(54) SUBSTRATE TRANSFER APPARATUS AND SUBSTRATE TRANSFER METHOD

(71) Applicant: TOKYO ELECTRON LIMITED, Tokyo (JP)

(72) Inventors: Akinori Shimamura, Yamanashi (JP); Hiroki Oka, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 509 days.

(21) Appl. No.: 17/980,255

(22) Filed: Nov. 3, 2022

(65) Prior Publication Data

US 2023/0154777 A1    May 18, 2023

(30) Foreign Application Priority Data

Nov. 12, 2021    (JP) ................................. 2021-185146

(51) Int. Cl.
| | |
|---|---|
| *H01L 21/677* | (2006.01) |
| *B08B 3/02* | (2006.01) |
| *B08B 5/02* | (2006.01) |
| *B08B 7/02* | (2006.01) |
| *B08B 13/00* | (2006.01) |
| *H01F 7/16* | (2006.01) |
| *H01L 21/67* | (2006.01) |

(52) U.S. Cl.
CPC .............. *H01L 21/677* (2013.01); *B08B 3/02* (2013.01); *B08B 5/02* (2013.01); *B08B 7/028* (2013.01); *B08B 13/00* (2013.01); *H01F 7/1646* (2013.01); *H01L 21/67196* (2013.01); *H01L 21/67017* (2013.01); *H01L 21/67161* (2013.01)

(58) Field of Classification Search
CPC .. B08B 3/02; B08B 5/02; B08B 7/028; B08B 13/00; H01F 7/1646; H01L 21/67017; H01L 21/67161; H01L 21/677
See application file for complete search history.

(56) References Cited

U.S. PATENT DOCUMENTS

| | | | | |
|---|---|---|---|---|
| 2003/0129045 A1* | 7/2003 | Bonora | ............. | H01L 21/67709 414/217 |
| 2005/0087300 A1* | 4/2005 | Ishizawa | ........... | H01L 21/67745 156/345.31 |
| 2011/0233923 A1* | 9/2011 | Kouketsu | .............. | F16L 59/065 285/123.3 |
| 2016/0218029 A1* | 7/2016 | Janakiraman | ..... | H01L 21/67709 |

(Continued)

FOREIGN PATENT DOCUMENTS

| | | | |
|---|---|---|---|
| JP | S60-261302 A | | 12/1985 |
| JP | H01228530 A | * | 9/1989 |

(Continued)

*Primary Examiner* — Saul Rodriguez
*Assistant Examiner* — Brendan P Tighe
(74) *Attorney, Agent, or Firm* — Fenwick & West LLP

(57) ABSTRACT

There is a substrate transfer apparatus comprising: a circular tube having a tube axis extending in a lateral direction and having a transfer region for a substrate in the circular tube; a magnetic field generating portion having a magnetic field generating surface facing the transfer region and configured to generate a magnetic field on the magnetic field generating surface; and a transfer body configured to transfer the substrate while moving in a plane direction of the magnetic field generating surface in a state that the transfer body is distant from the magnetic field generating surface by the magnetic field.

17 Claims, 14 Drawing Sheets

(56) References Cited

U.S. PATENT DOCUMENTS

| | | | |
|---|---|---|---|
| 2016/0273541 A1* | 9/2016 | Yang ....................... | F04D 25/00 |
| 2018/0294176 A1* | 10/2018 | Nakagawasai .... | H01L 21/68792 |
| 2021/0249291 A1* | 8/2021 | Raatz .................... | B65G 54/02 |
| 2021/0265188 A1* | 8/2021 | Moura ............. | H01L 21/67161 |
| 2022/0111539 A1* | 4/2022 | Yamaguchi .......... | B25J 11/0095 |
| 2022/0130701 A1* | 4/2022 | Hatano ............... | H02K 41/031 |
| 2022/0223447 A1* | 7/2022 | Hatano .............. | H01L 21/6838 |
| 2022/0285191 A1* | 9/2022 | Li ..................... | H01L 21/68707 |
| 2022/0301921 A1* | 9/2022 | Shindo ............. | H01L 21/67167 |
| 2022/0336260 A1* | 10/2022 | Shindo .................... | G05D 1/43 |
| 2022/0415687 A1* | 12/2022 | Hatano ............... | H02K 41/031 |
| 2023/0085667 A1* | 3/2023 | Hudgens .......... | H01L 21/67706 |
| | | | 414/800 |
| 2023/0143372 A1* | 5/2023 | Matsumoto ........ | H01L 21/6719 |
| | | | 414/804 |
| 2023/0170239 A1* | 6/2023 | Shindo ............. | H01L 21/67742 |
| | | | 414/749.1 |
| 2023/0307278 A1* | 9/2023 | Li .......................... | H01F 7/206 |

FOREIGN PATENT DOCUMENTS

| | | | |
|---|---|---|---|
| JP | H0564314 A | * | 3/1993 |
| JP | 2007-149948 A | | 6/2007 |
| JP | 2015-140901 A | | 8/2015 |
| JP | 2020-170866 A | | 10/2020 |
| KR | 20190075230 A | * | 7/2019 |
| WO | WO 2013/072760 A2 | | 5/2013 |

* cited by examiner

SUBSTRATE TRANSFER APPARATUS AND SUBSTRATE TRANSFER METHOD

CROSS-REFERENCE TO RELATED APPLICATIONS

This application claims priority to Japanese Patent Application No. 2021-185146 filed on Nov. 12, 2021, the entire contents of which are incorporated herein by reference.

TECHNICAL FIELD

The present disclosure relates to a substrate transfer apparatus and a substrate transfer method.

BACKGROUND

In a semiconductor device manufacturing process, a semiconductor wafer (hereinafter, referred to as "wafer") that is a substrate is transferred and processed in an apparatus.

Japanese Laid-open Patent Publication No. 2020-170866 discloses an apparatus in which a plurality of vacuum modules, each being provided with a robot for transferring a wafer, are arranged and connected to each other by vacuum lines. Each vacuum module is connected to a processing module and configured to transfer a wafer using a robot. A multi joint arm having a bottom portion disposed on the floor of the vacuum module is described as an example of the robot. The shape of the vacuum line is not described.

SUMMARY

The present disclosure provides a substrate transfer apparatus capable of suppressing an increase of an occupied floor area and a weight.

In accordance with an aspect of the present disclosure, there is a substrate transfer apparatus comprising: a circular tube having a tube axis extending in a lateral direction and having a transfer region for a substrate in the circular tube; a magnetic field generating portion having a magnetic field generating surface facing the transfer region and configured to generate a magnetic field on the magnetic field generating surface; and a transfer body configured to transfer the substrate while moving in a plane direction of the magnetic field generating surface in a state that the transfer body is distant from the magnetic field generating surface by the magnetic field.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
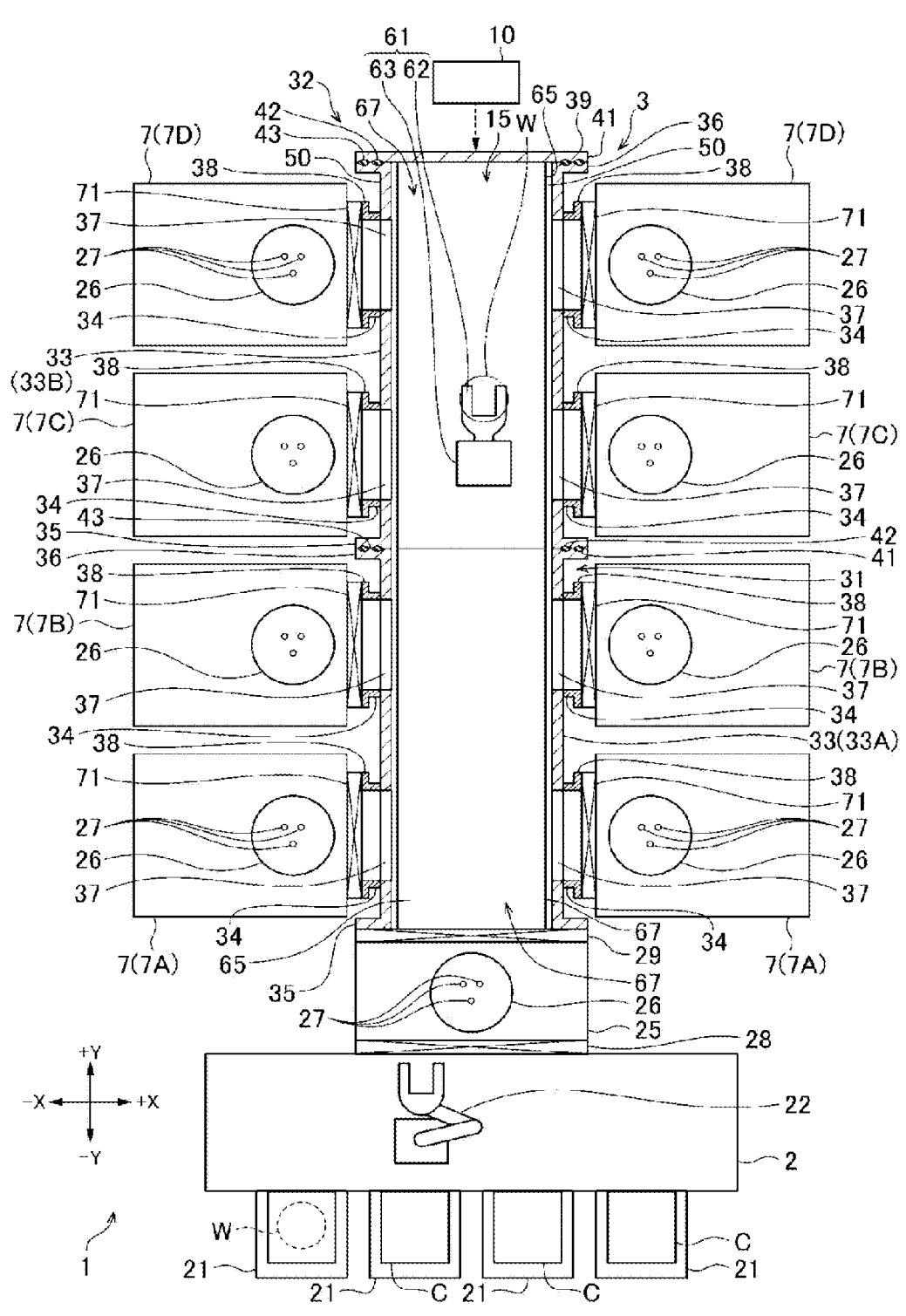
FIG. 1 is a plan view of a substrate processing apparatus including a substrate transfer module according to an embodiment of the present disclosure.

FIG. 1 shows a substrate processing apparatus 1 including a substrate transfer apparatus according to an embodiment of the present disclosure. The substrate processing apparatus 1 is installed in an atmospheric environment and includes a loader module 2, a load-lock module 25, a vacuum transfer module 3, and eight processing modules 7. Each processing module 7 processes a wafer W that is a circular substrate in a vacuum atmosphere.

The loader module 2 is referred to as "equipment front end module (EFEM)" and loads and unloads the wafer W to and from a transfer container C referred to as "front open unified pod (FOUP)" accommodating wafers W. A wafer W unloaded from the transfer container C is loaded into the substrate processing apparatus 1. The loader module 2 is horizontally elongated, and has an inner atmosphere maintained in an atmospheric atmosphere and a normal pressure atmosphere. Hereinafter, the lengthwise direction of the loader module 2 will be described as the X direction, and the direction perpendicular to the X direction will be described as the Y direction. The X and Y directions are horizontal directions. One side and the other side in the X direction will be described as the +X side and the −X side, respectively, and one side and the other side in the Y direction will be described as the +Y side and the −Y side, respectively.

On the −Y side of the loader module 2, three container placing tables 21 for placing the transfer containers C thereon are arranged side by side in the X direction, for example. A transfer mechanism 22 is disposed in the loader module 2. The transfer mechanism 22 does not magnetically levitate unlike a transfer body 61 to be described later, and is configured as a multi-joint arm that can be raised and lowered and movable in the X direction. The wafer W is transferred between the transfer container C on the container placing table 21 and the load-lock module 25 by the transfer mechanism 22.

The load-lock module 25 is disposed on the +Y side of the loader module 2, and the vacuum transfer module 3 is disposed on the +Y side of the load-lock module 25. The load-lock module 25 has therein a stage 26 for placing a wafer W. The stage 26 is provided with three lift pins 27 that protrude from and retract below the upper surface of the stage 26, and the wafer W can be delivered between the transfer body 61 of the vacuum transfer module 3 and the transfer mechanism 22 of the loader module 2 via the lift pins 27.

A door valve 28 is interposed between the load-lock module 25 and the loader module 2, and a gate valve 29 is interposed between the load-lock module 25 and the vacuum transfer module 3. N₂ (nitrogen) gas can be supplied into and discharged from the load-lock module 25, and an inner atmosphere of the load-lock module 25 can be switched between a vacuum atmosphere and a normal pressure atmosphere that is an N₂ gas atmosphere in a state where the door valve 28 and the gate valve 29 are closed. The inner atmosphere of the load-lock module 25 is set to a vacuum atmosphere in the case of transferring the wafer W to the vacuum transfer module 3, and is set to a normal pressure atmosphere in the case of transferring the wafer W to the loader module 2.

Figure 2:
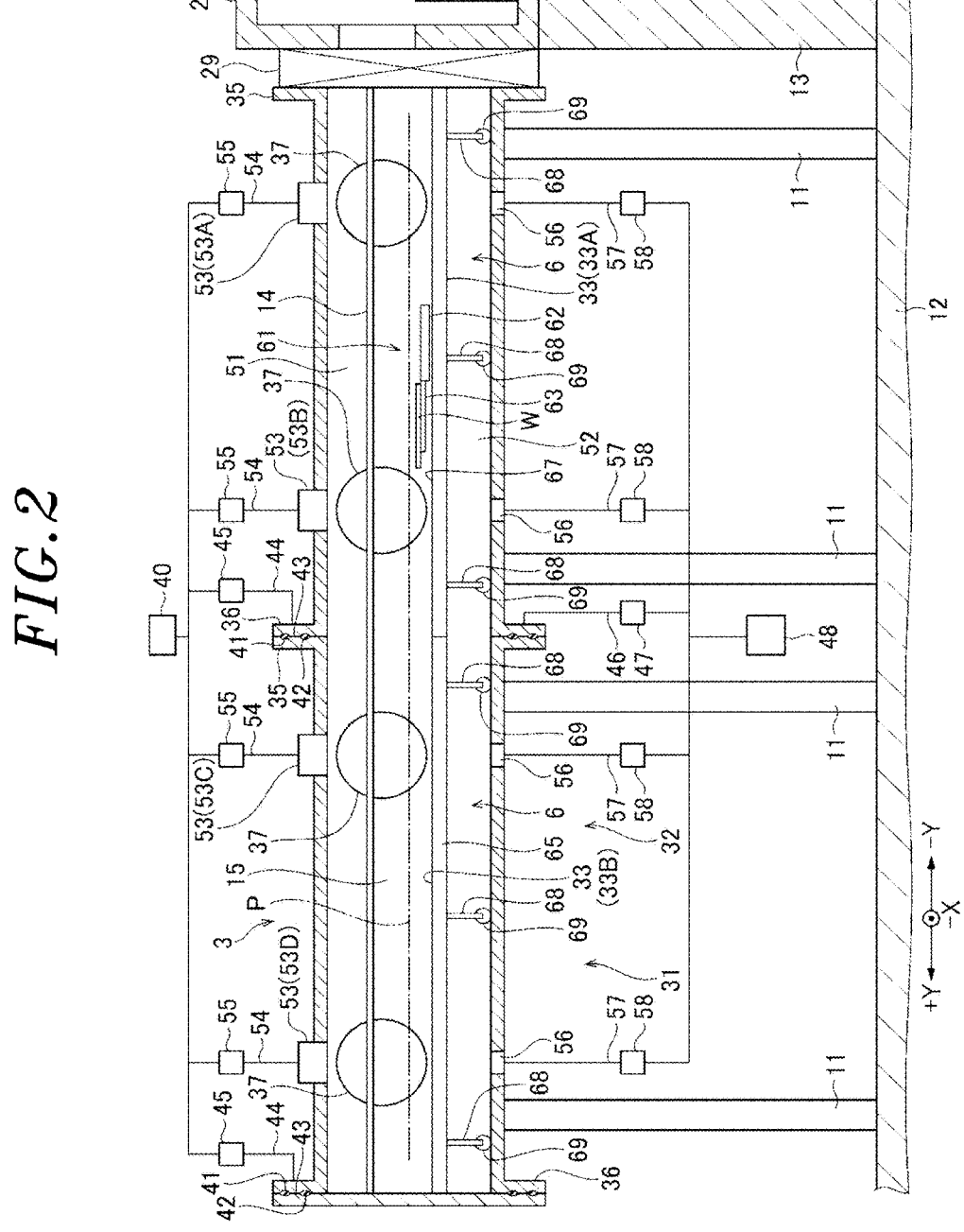
FIG. 2 is a vertical cross-sectional view of a vacuum transfer module along the tube axis of the module.
Figure 3:
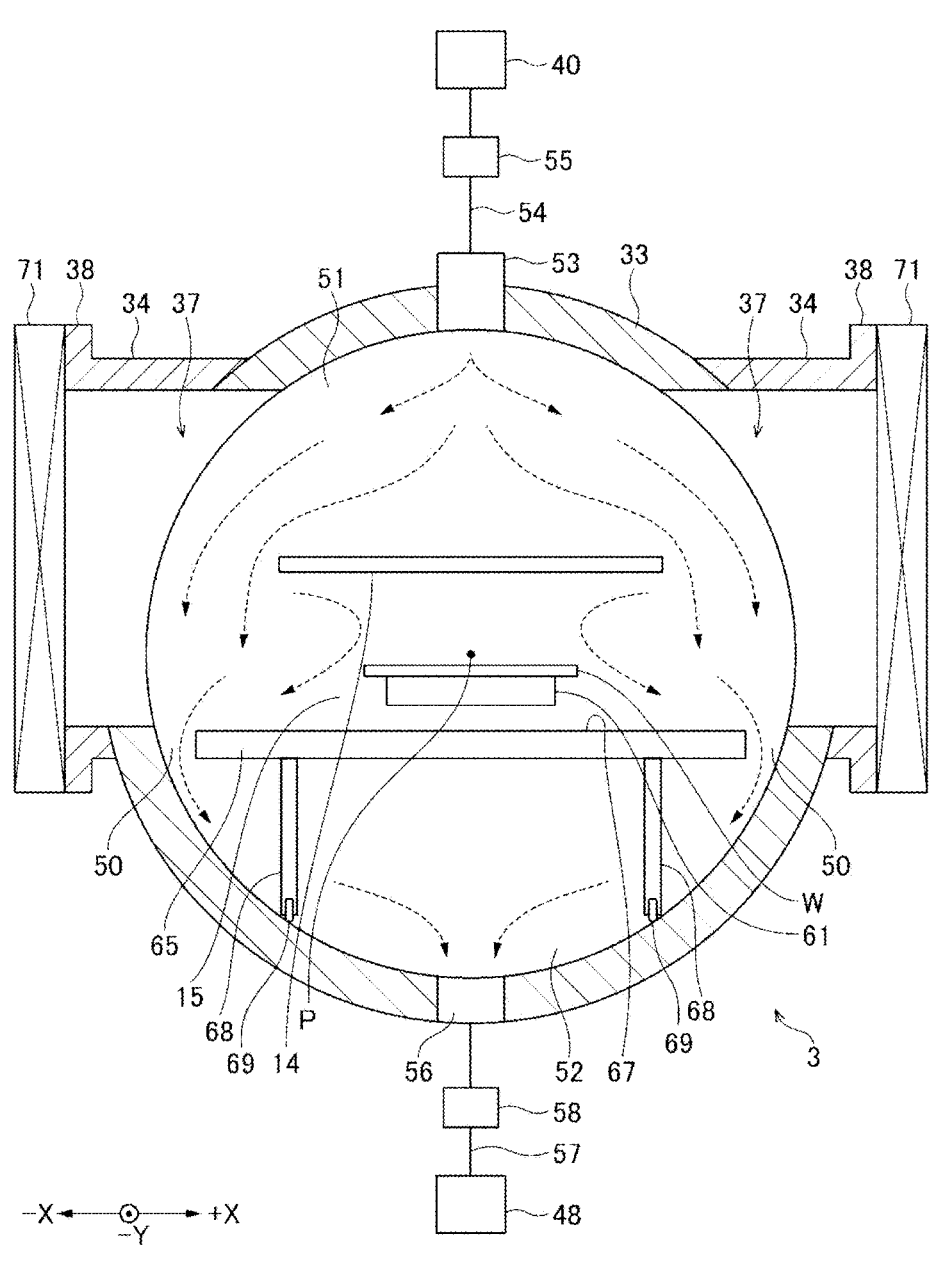
FIG. 3 is a longitudinal cross-sectional view of the vacuum transfer module perpendicular to the tube axis.

Next, the outline of the vacuum transfer module 3 that is a substrate transfer apparatus will be described with reference to the longitudinal cross-sectional views of FIGS. 2 and 3. The vacuum transfer module 3 includes a housing 31, a magnetic field generating unit 6, and the transfer body 61. The magnetic field generating unit 6 and the transfer body 61 are disposed in the housing 31. The housing 31 has a sealed inner space, and is evacuated to a vacuum atmosphere. The transfer body 61 moves laterally while floating from a floor plate 65 due to the magnetic field generated by the floor plate 65 constituting the magnetic field generating unit 6, and transfers the wafer W between the load-lock module 25 and the processing module 7 and between the processing modules 7. Since the transfer body 61 moves in a floating state, dust generation is prevented and the inner spaces of the vacuum transfer module 3 and the processing module 7 are maintained in a clean state. In addition, the occurrence of abnormal processing due to adhesion of foreign substances to the wafer W is suppressed.

The housing 31 will be described in detail. The housing 31 includes a joint circular tube 32, a partition wall 39, and eight side tubes 34. The joint circular tube 32 is a straight tube, and a tube axis P of the joint circular tube 32 extends along the Y direction. Therefore, the tube axis P extends laterally, more specifically horizontally. FIG. 2 is a longitudinal cross-sectional view taken along the tube axis P, and FIG. 3 is a longitudinal cross-sectional view taken along a direction perpendicular to the axial direction of the tube axis P. In order to avoid complicated illustration, the tube axis P is not illustrated in FIG. 3 and is illustrated only in FIG. 2.

The joint circular tube 32 is formed by connecting two circular tubes 33 made of a metal such that the tube axes thereof overlap each other. Therefore, the tube axis P of the joint circular tube 32 coincides with the tube axes of the circular tubes 33. Among the eight side tubes 34, four side tubes 34 are attached to one of the circular tubes 33, and the other four side tubes 34 are attached to the other circular tube 33. Reference numeral 11 in FIG. 2 denotes a plurality of support columns arranged at intervals in the Y direction. The support columns 11 supports the two circular tubes 33 on the floor 12 on which the substrate processing apparatus 1 is installed. The heights of the supported circular tubes 33 may be aligned with the height of the load-lock module 25 supported on the floor 12 by a support 13.

Figure 4:
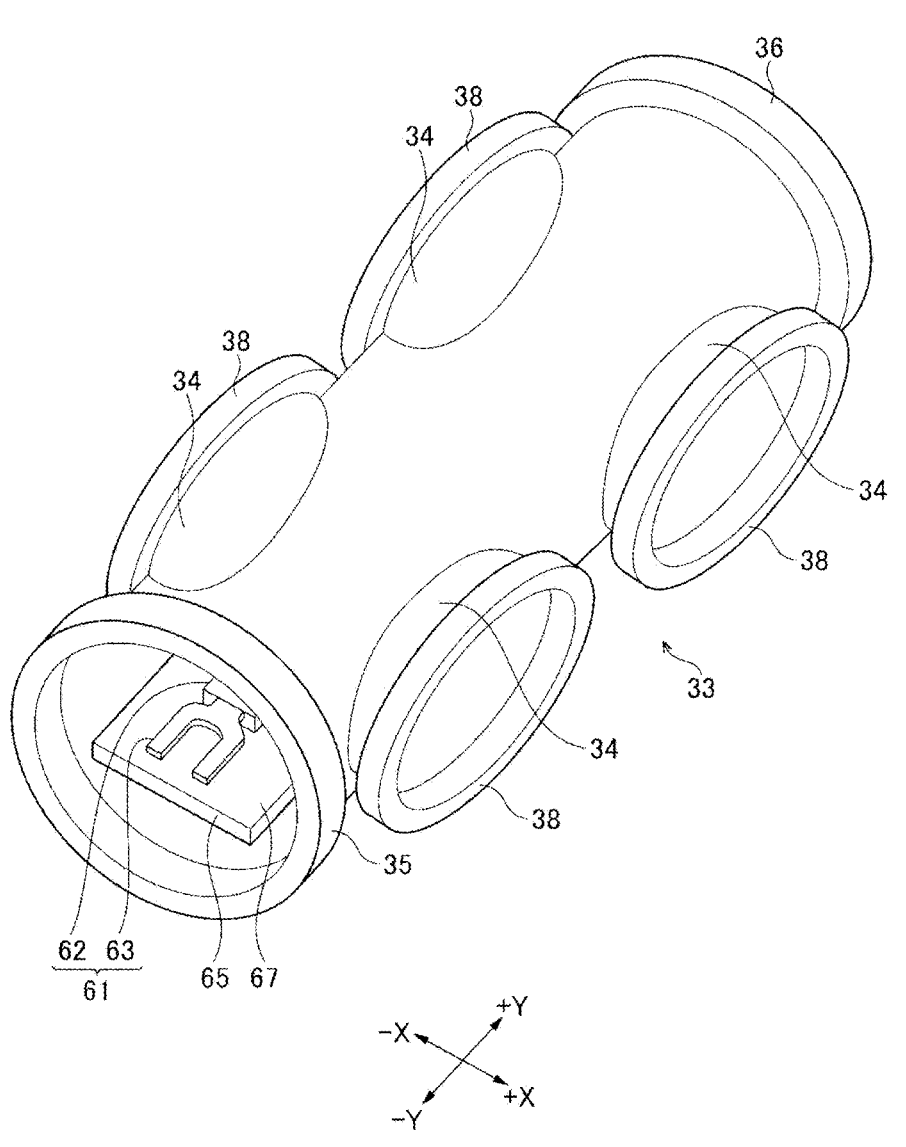
FIG. 4 is a perspective view of a circular tube that constitutes the vacuum transfer module.

The circular tubes 33 are connected to form the joint circular tube 32, thereby forming a part of the housing 31. The circular tube 33 will be described with reference to the perspective view of FIG. 4. The −Y side end and the +Y side end of the circular tube 33 are widened outward to form flanges 35 and 36, respectively. Further, two circular openings 37 are disposed on each of the sidewall on the +X side and the sidewall on the −X side while being spaced apart from each other in the Y direction. The two openings 37 on the −Y side face each other, and the two openings 37 on the +Y side face each other. Therefore, the four openings 37 are arranged in a 2×2 matrix shape in plan view.

The two side tubes 34 are disposed on each of the −X side and +X side of the outer circumference of the circular tube 33. Each side tube 34 is an extremely short circular tube, and one ends of the four side tubes 34 are connected to the peripheral portions of the openings 37. The other ends of the side tubes 34 extend in the direction opposite to the tube axis P along the X direction. The other ends of the side tubes 34 are widened outward from the side tubes 34 to form flanges 38.

Hereinafter, in order to distinguish the two circular tubes 33, the circular tube positioned on the −Y side may be referred to as "circular tube 33A" and the circular tube positioned on the +Y side may be referred to as "circular tube 33B." Next, the connection between the circular tubes 33A and 33B and other members will be described. The flange 35 of the circular tube 33A is connected to the gate valve 29. When the gate valve 29 is opened, the circular tube 33A and the load-lock module 25 communicate with each other so that the wafer W can be transferred between the vacuum transfer module 3 and the load-lock module 25. The flange 36 of the circular tube 33B is connected to the partition wall 39. The partition wall 39 is provided to close the opening on the +Y side of the circular tube 33B.

The processing modules 7 are connected to the flanges 38 of the side tubes 34 in the X direction through gate valves 71. Hence, transfer paths for wafers W, which are formed by the side tubes 34, are opened on the side surface of the joint circular tube 32 to be spaced apart from each other along the tube axis P. These transfer paths are opened and closed by the gate valves 71. The eight processing modules 7 are arranged in a 2×4 matrix shape in plan view. The gate valves 71 connected to the processing modules 7 are closed except when it is required to transfer wafers W, and isolates the atmospheres between the modules. This is also applied to the door valve 28 and the gate valve 29. The processing modules 7 may be referred to as "processing modules 7A to 7D" when it is required to distinguish them. The processing modules 7A to 7D are arranged in that order from the −Y side toward the +Y side. In other words, two processing modules 7A, two processing modules 7B, two processing modules 7C, and two processing modules 7D are provided.

Hereinafter, the configuration of the processing modules 7 will be described. Each processing module 7 has a processing container that is evacuated to a vacuum atmosphere by an exhaust mechanism (not shown). The stage 26 provided with the lift pins 27 is disposed in the processing container, similarly to the load-lock module 25. In addition, the stage 26 in the processing module 7 is provided with a temperature controller, e.g., a heater or a flow path through which a fluid whose temperature is adjusted by a chiller unit flows, so that processing can be performed in a state where a temperature of the wafer W placed on the stage 26 to a desired temperature.

The processing container is provided with a gas supply device (not shown) such as a gas shower head or the like, and a processing gas is supplied into the processing container maintained in a vacuum atmosphere. When the wafer W placed on the stage 26 and having a controlled temperature is exposed to the processing gas, the processing using the processing gas is performed. The processing includes etching, film formation, annealing, or the like. In addition, a plasma producing mechanism may be provided so that the processing using plasma produced from the processing gas can be performed.

Figure 5:
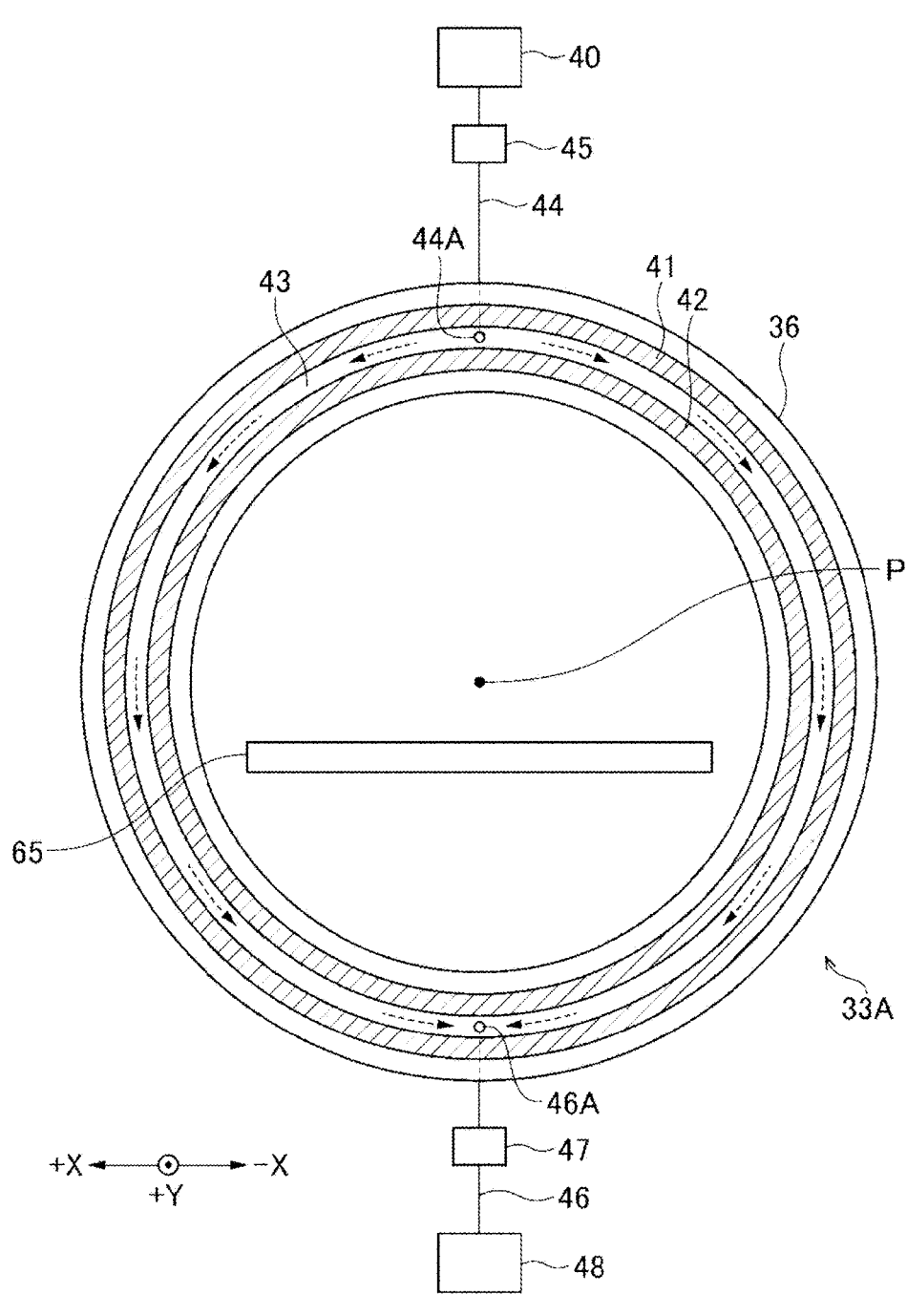
FIG. 5 is a front view of a flange at the end of the circular tube that constitutes the vacuum transfer module.

Next, the connection between the circular tube 33A and the circular tube 33B will be described with reference to FIG. 5 that is the front view of the flange 36 of the circular tube 33A viewed from the +Y side. The flange 36 of the circular tube 33A and the flange 35 of the circular tube 33B face each other, and O-rings 41 and 42 are interposed between the flanges 35 and 36 to be in close contact with the flanges 35 and 36. The O-rings 41 and 42 are annular sealing members that are concentric with respect to a point on the tube axis P, and the diameter of the O-ring 41 is greater than that of the O-ring 42. Thus, the O-rings 41 and 42 are disposed along the tube openings of the circular tubes 33A and 33B. An annular gap 43 is formed between the outer circumference of the O-ring 42 and the inner circumference of the O-ring 41.

The flanges 35 and 36 connected to each other via the O-rings 41 and 42 are fixed to each other by fixing tools (not shown) such as bolts or the like, and the fixing therebetween can be released by removing the fixing tools. In other words, the circular tubes 33A and 33B are detachable. Since the circular tubes 33 are detachable, it is possible to facilitate the attachment/detachment of the magnetic field generating unit 6 to/from the housing 31, which will be described later. Further, since the circular tubes 33A and 33B are detachable, $N_2$ gas flow can be formed in the gap 43 to prevent the atmosphere outside the housing 31 from flowing into the circular tubes 33A and 33B through the gap between the flanges 35 and 36.

A mechanism for forming such flow will be described. A downstream end of a line 44 is connected from the −Y side to the flange 36 of the circular tube 33A. The upstream side of the line 44 is connected to the gap 43 via a hole 44A bored in a thickness direction (Y direction) of the flange 36. An upstream end of the line 44 is connected to a gas supply source 40 via a flow rate controller 45. The gas supply source 40 supplies a clean inert gas such as $N_2$ gas to the line 44. The flow rate controller 45 includes a valve or a mass flow controller to control the amount of $N_2$ gas supplied to the downstream side of the line 44.

An upstream end of an exhaust line 46 is connected from the −Y side to the flange 36, and a downstream side of the exhaust line 46 is opened to the gap 43 via a hole 46A bored in the thickness direction (Y direction) of the flange 36. The position of the hole 44A and the position of the hole 46A are spaced apart from each other by about 180 degrees when viewed from the tube axis P so that the $N_2$ gas can be uniformly supplied to each part of the gap 43.

The downstream end of the exhaust line 46 is connected to an exhaust mechanism 48 via an exhaust amount controller 47. The exhaust mechanism 48 is, e.g., a vacuum pump. The exhaust amount controller 47 is, e.g., a valve, and controls the exhaust amount from the exhaust line 46. When the housing 3 is exhausted to a vacuum atmosphere in order to transfer the wafer W, the supply of $N_2$ gas (second gas) to the gap 43 and the exhaust of the gas from the gap 43 are performed, thereby generating air flow along the circumference of the annular gap 43 as indicated by dashed arrows in FIG. 5. Such air flow is constantly formed during the operation of the substrate processing apparatus 1 in which the housing 31 is maintained in a vacuum atmosphere. Even if the atmosphere flows into the gap 43 from the outside of the housing 31, the atmosphere is carried away by the air flow and exhausted, thereby preventing the atmosphere from flowing into the housing 31.

The circular tube 33A is a first circular tube, and the circular tube 33B is a second circular tube. The flange 36 of the circular tube 33A is a first flange, and the flange 35 of the circular tube 33B is a second flange. The O-ring 41 is a first sealing member, and the O-ring 42 is a second sealing member. An air flow forming mechanism includes the gas supply source 40, the flow rate controller 45, the exhaust amount controller 47, the line 44, and the exhaust line 46.

In the following description, it is assumed that flow rate controllers other than the flow rate controller 45 have the same configuration as that of the flow rate controller 45, and are configured to control the flow rate of the gas flowing toward the downstream side of the line in which the flow rate controller is disposed. The flow rate control includes the setting of the flow rate to 0 (i.e., stopping the gas supply). In the following description, it is also assumed that the exhaust amount controllers other than the exhaust amount controller 47 have the same configuration as that of the exhaust amount controller 47, and are configured to control the flow rate of the gas flowing toward the downstream side of the exhaust line in which the exhaust amount controller is disposed.

The connection between the circular tube 33B and the partition wall 39 is the same as the connection between the circular tubes 33A and 33B. Specifically, the partition wall 39 can be attached to and detached from the flange 36 of the circular tube 33B via fixing tools, and the O-rings 41 and 42 are interposed between the flange 36 and the partition wall 39. $N_2$ gas is also supplied into the gap 43 between the O-rings 41 and 42 and exhausted from the gap 43 through the line 44 and the exhaust line 46, thereby forming air flow along the circumference of the gap 43.

Figure 6:
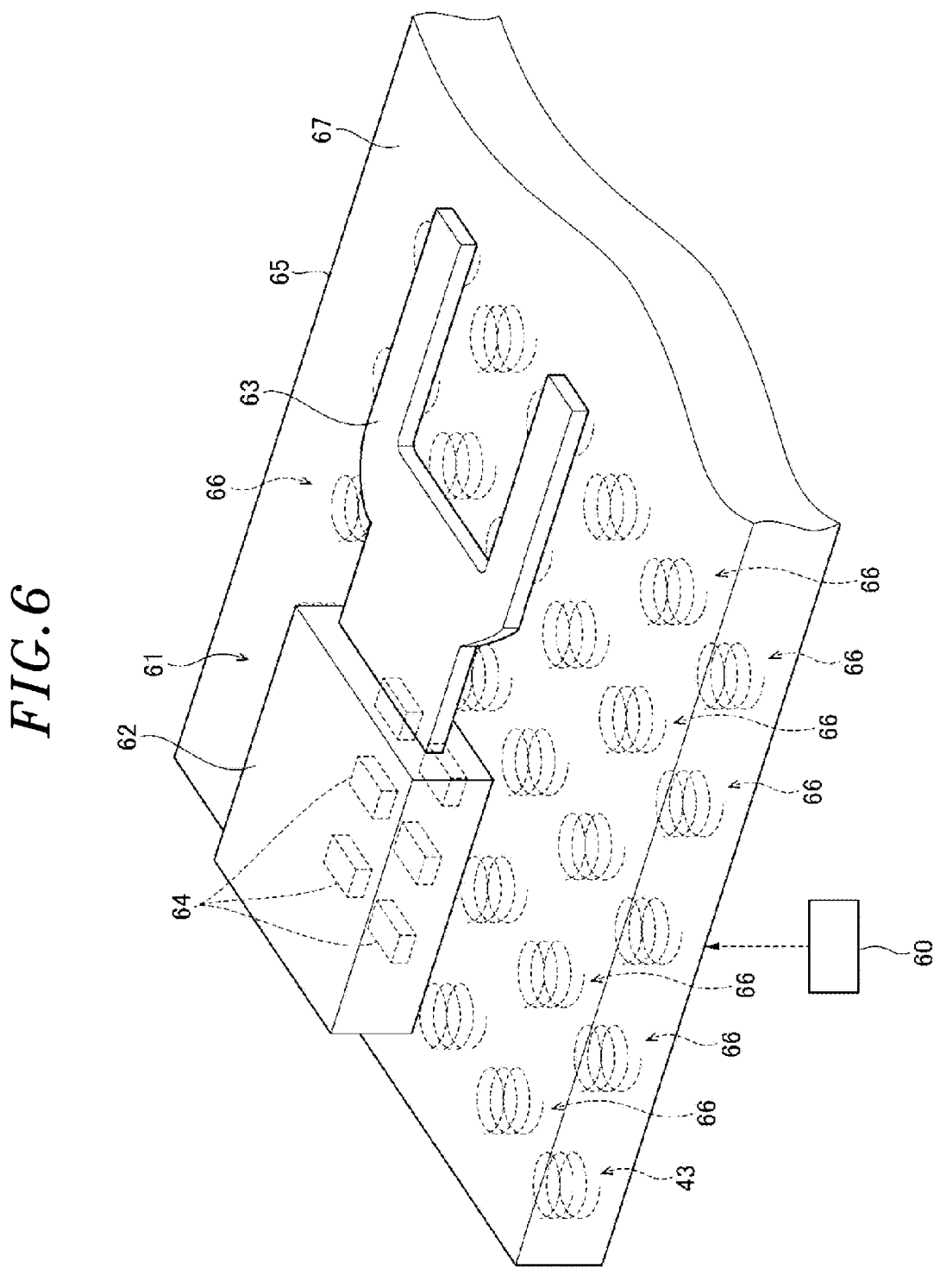
FIG. 6 is a perspective view of a transfer body and a floor plate provided in the substrate processing apparatus.

Next, the transfer body 61 and the magnetic field generating unit 6 will be described with reference to FIG. 6. The transfer body 61 includes a moving body 62 and a support 63. The moving body 62 has a magnet 64 that is a permanent magnet, for example. The support 63 is disposed on the side of the moving body 62, and the wafer W is supported on the support 63. In this example, the support 63 has a bifurcated fork shape to avoid interference with the lift pins 27 at the time of delivering the wafer W to each module.

The magnetic field generating unit 6 disposed in the housing 31 is provided in each of the circular tubes 33A and 33B. The magnetic field generating unit 6 includes a floor plate 65, columns 68, and wheels 69. The floor plate 65 is a flat plate, and a plurality of coils 66 are distributed and embedded therein in the plane direction thereof. A power is individually supplied to each coil 66 from a power supply device 60. The coil 66 generates a magnetic field on a magnetic field generating surface 67 that is the main surface of the floor plate 65 and directed upward with an intensity corresponding to the power supplied thereto. In other words, each coil 66 acts as an electromagnet. In this example, the magnetic field generating surface 67 forms a horizontal surface. The magnet 64 of the transfer body 61 and the energized coil 66 repel each other due to a magnetic force, and the transfer body 61 floats from the magnetic field generating surface 67.

Since the distribution and intensity of the magnetic field on the magnetic field generating surface 67 are controlled by switching the coils 66 to which the power is supplied and adjusting the amount of power to be supplied, it is possible to move the transfer body 61 in a floating state in the X and Y directions, change the direction, stop the movement, and change a floating height from the magnetic field generating surface 67. Here, the movement in the X and Y directions include both separate movement in the X and Y directions and simultaneous movement in the X and Y directions. The transfer body 61 can move between different positions over the magnetic field generating surface 67 in the plane direction of the magnetic field generating surface 67. The support 63 enters a module as a transfer destination in a state where the moving body 62 constituting the transfer body 61 is positioned over the magnetic field generating surface 67, so that the wafer W is delivered to and from the module.

Hereinafter, the floor plate 65 that is a magnetic field generating portion will be described further. The floor plate 65 is elongated in the Y direction, and has a length that is substantially the same as that of the circular tube 33. The floor plate 65 of the circular tube 33A and the floor plate 65 of the circular tube 33B are positioned at the same height, and are in contact with each other. Therefore, the inner space of the joint circular tube 32 is divided into an upper space 51 and a lower space 52 by the floor plate 65 from one end to the other end in the tube axis direction.

In the lower space 52, various devices for driving the substrate processing apparatus 1 are installed, for example. The floor plate 65 is formed by connecting magnetic field generating plates 80 formed in a substantially square tile shape in plan view to each other in the Y direction. In FIGS. 1 to 6, the magnetic field generating plates 80 are not illustrated to avoid complicated illustration. The magnetic field generating plate 80 is illustrated in the following embodiment. The side surfaces of the floor plate 65 facing the +X direction and the −X direction are spaced from the inner circumferential surface of the circular tube 33, and a communication path 50 through which the upper space 51 and the lower space 52 communicate with each other is formed between the side surfaces of the floor plate 65 and the inner circumferential surface of the circular tube 33 (see FIG. 3).

The plurality of columns 68 spaced apart from each other at intervals in the Y direction are arranged at each of the +X side end and the −X side end of the floor plate 65 to support the +X side end and the −X side end of the floor plate 65 from below. The wheels 69 are disposed at the lower ends of the respective columns 68, and can rotate about the axis extending in the X direction. The magnetic field generating unit 6 can be attached to and detached from the circular tube 33 using the wheels 69. The sequence of the attachment/detachment will be described later.

Next, the housing 31 will be further described. In the upper space 51 in the joint circular tube 32, a heat shield plate 14 that is a heat shield member is disposed above the floor plate 65 to face the floor plate 65. The heat shield plate 14 extends from one end to the other end in the Y direction of the upper space 51. The region between the heat shield plate 14 and the floor plate 65 serves as a transfer region 15 where the wafer W is transferred by the transfer body 61. Therefore, the magnetic field generating surface 67 of the floor plate 65 faces the transfer region 15, and the heat shield plate 14 is disposed on the opposite side of the magnetic field generating surface 67 with respect to the transfer region 15. The side tubes 34 are opened to the transfer region 15 so that the transfer body 61 can transfer the wafer W to and from the processing modules 7.

The heat shield plate 14 has a function of shielding the radiant heat directed from the wafer W toward the tube wall of the joint circular tube 32. In other words, even if the wafer W is processed in the processing module 7 and transferred at a relatively high temperature into the joint circular tube 32, the heat shield plate 14 prevents the temperature of the tube wall and further the vicinity of the vacuum transfer module 3 from increasing due to the radiant heat from the wafer W. Accordingly, it is possible to prevent the processing performed by another apparatus from becoming abnormal at the outside the substrate processing apparatus 1, and also possible to prevent an operator from being unable to move or perform an operation.

Gas nozzles 53 are disposed at the upper portion of the joint circular tube 32, and the injection ports of the gas nozzles 53 are directed downward. In other words, the injection ports are opened to the upper space 51. As shown in FIG. 2, the gas nozzles 53 are arranged at intervals in the Y direction. In this example, four gas nozzles 53 are provided. The gas nozzles 53 may be referred to as "gas nozzles 53A, 53B, 53C, and 53D" arranged from the −Y side toward the +Y side so that they can be distinguished from each other. For example, the Y direction positions of the gas nozzles 53A, 53B, 53C, and 53D are aligned with the Y direction positions of the processing modules 7A, 7B, 7C, and 7D, respectively.

The gas nozzles 53 are connected to the gas supply source 40 through lines 54. Each line 54 is provided with a flow rate controller 55, so that the flow rate of $N_2$ gas injected from each gas nozzle 53 can be individually adjusted. A plurality of exhaust ports 56 that are opened to the lower space 52 are disposed at the bottom portion of the joint circular tube 32. The exhaust ports 56 are arranged at intervals in the Y direction. One ends of exhaust lines 57 are respectively connected to the exhaust ports 56, and the other ends of the exhaust lines 57 are connected to the exhaust mechanism 48 through an exhaust amount controller 58. The injection ports of the gas nozzles 53 are first gas supply ports. Therefore, the first gas supply ports are opened at different positions in the tube axis direction of the joint circular tube 32. The $N_2$ gas injected from the gas nozzles 53 is a first gas.

The housing 31 is exhausted from the exhaust ports 56 during the operation of the substrate processing apparatus 1, so that an inner atmosphere of the housing 31 is set to a vacuum atmosphere of a desired pressure. At the same time, $N_2$ gas is supplied from the gas nozzles 53, so that the pressure in the housing 31 reaches a desired vacuum pressure, and the wafer W is transferred. The dashed arrows in FIG. 3 indicate the flow of the $N_2$ gas. As shown in FIG. 3, the $N_2$ gas flowing downward in the upper space 51 flows to the position below the heat shield plate 14 and flows downward in the transfer region 15. Then, the $N_2$ gas flows into the lower space 52 through the communication path 50, and then flows into the exhaust ports 56 and is removed.

As described above, the $N_2$ gas injected from the gas nozzles 53 flows as a purge gas to purge the upper space 51 and removes foreign substances such as particles and the like from the upper space 51. In addition, as described above, even if particles, for example, are generated in the lower space 52 where devices (not shown) are provided, the scattering of the particles into the upper space 51 can be suppressed by the flow of the purge gas. Due to the structure in which the circular tube 33 is divided into the upper space and the lower space and the action of the purge gas supplied to the upper space 51, the upper space 51 and the wafer W transferred to the transfer region 15 forming the upper space 51 is maintained in a clean state.

It is preferable that the pressure in the upper space 51 is higher than that in the lower space 52 so that the flow velocity of the $N_2$ gas toward the lower space 52 can be increased and the upper space 51 can be cleaned more reliably. In other words, it is preferable to control the amount of $N_2$ gas supplied from each gas nozzle 53 and the exhaust amount from each exhaust port 56 (i.e., control the operations of the flow rate controller 55 and the exhaust amount controller 58) so that the pressure difference can be obtained.

The communicating path 50 on the side of the floor plate 65 is formed to have an appropriate width (length in the X direction) so that the pressure difference can be obtained. In order to suppress the gas flow between the processing container of the processing module 7 and the housing 31 at the time of opening the gate valve 71 and the movement of foreign substances such as particles and the like due to the gas flow, it is preferable to minimize the pressure difference between the processing module 7 and the upper space 51.

As described above, the gas nozzles 53A to 53D are aligned in the Y direction, and thus are positioned relatively close to two processing modules 7. Therefore, the $N_2$ gas injected from the gas nozzles 53A to 53D is supplied to the region in the upper space 51 that faces the gate valves 71 connected to the processing modules 7 positioned relatively thereto. The gas nozzles 53 aligned in the Y direction are associated with the gate valves 71 connected to the processing modules 7, so that each of the flow rate controllers 55 operates such that the flow rate of the $N_2$ gas from the corresponding gas nozzle 53 changes depending on the opening/closing of the corresponding gate valve 71.

Figure 7:
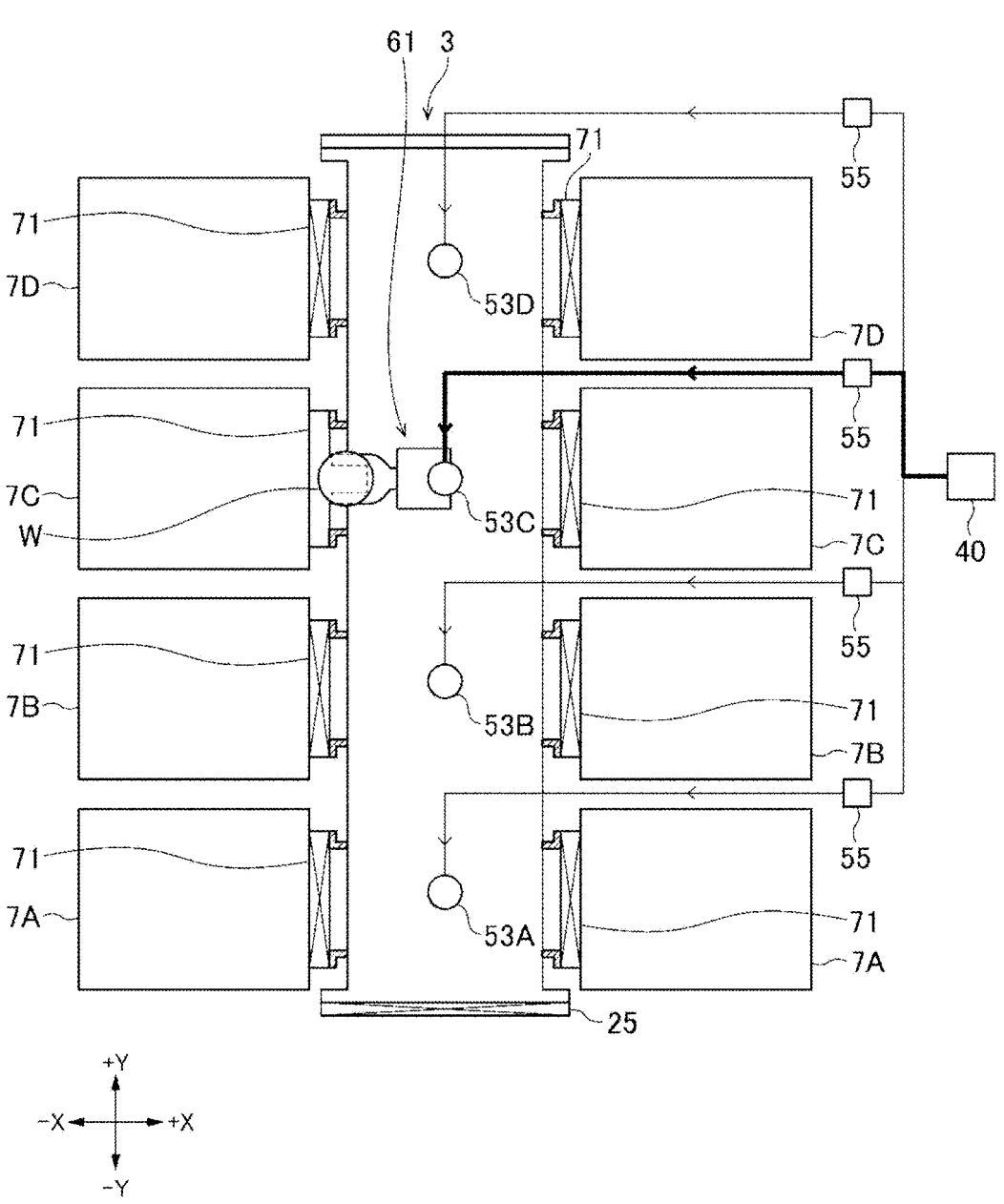
FIG. 7 explains an example of nitrogen gas supply in the vacuum transfer module.

More specifically, the gas nozzles 53 supply $N_2$ gas at a first flow rate when all the corresponding gate valves 71 are closed. On the other hand, the gas nozzles 53 supply $N_2$ gas at a second flow rate higher than the first flow rate when one of the two corresponding gate valves 71 is opened. Therefore, the flow rate of the gas from the gas nozzles 53 in the case where any one of the corresponding gate valves 71 is opened is greater than the flow rate of the gas from the gas nozzles 53 in the case where all the corresponding gate valves 71 are closed. FIG. 7 shows a specific example of the gas flow rate control. In this example of FIG. 7, the gate valve 71 connected to the processing module 7C is opened, and the gate valves 71 connected to the processing modules 7A, 7B, and 7D are closed. Accordingly, $N_2$ gas is injected from the gas nozzles 53A, 53B, and 53D at the first flow rate, and $N_2$ gas is injected from the gas nozzle 53C at the second flow rate.

By supplying the $N_2$ gas at the second flow rate, the flow velocity of the $N_2$ gas in the region of the upper space 51 that faces the opened gate valve 71 increases, thereby suppressing the diffusion of the gas from the processing module 7 into the housing 31. As a result, the outflow of foreign substances to the transfer region 15 due to the diffusion of the gas is suppressed.

Since the joint circular tube 32 is elongated in the Y direction, the plurality of gas nozzles 53 are provided as described above. If the flow rate of $N_2$ gas from the gas nozzles 53 is constantly increased in order to enhance the effect of suppressing the diffusion of the gas from the processing module 7, the amount of $N_2$ gas used during the operation of the substrate processing apparatus 1 is increased. Since, however, the flow rates of the gases from the gas nozzles 53 are controlled depending on the opening/closing of the corresponding gate valves 71, it is possible to effectively suppress the diffusion of the gas from the processing module 7 to the upper space 51 while reducing the amount of $N_2$ gas used. The flow rate controller 55 for controlling the flow rate of the gas supplied to the gas nozzles 53 and the gas supply source 40 constitute a first gas supply device.

The flow rate of $N_2$ gas supplied from the gas nozzles 53 other than the gas nozzle 53 that injects $N_2$ gas at the second flow rate may be decreased from the first flow rate. In that case, the supply of $N_2$ gas from the corresponding gas nozzles 53 may be stopped. Specifically, when $N_2$ gas is injected from the gas nozzle 53C at the second flow rate as shown in FIG. 7, the flow rate of $N_2$ gas injected from the gas nozzles 53A, 53B, and 53D may be lower than the first flow rate, or the injection thereof may be stopped.

The exhaust ports 56 may also be associated with the gate valves 71 positioned relatively close thereto in the Y direction. When all the corresponding gate valves 71 are closed, the exhaust is performed at a first exhaust amount. When any of the corresponding gate valves 71 is opened, the operation of the exhaust amount controller 47 may be controlled such that the exhaust is performed at a second exhaust amount greater than the first exhaust amount. Accordingly, it is possible to increase the flow velocity of the gas in the region facing the corresponding gate valves 71, and also possible to suppress the diffusion of the gas from the processing module 7 to the upper space 51. The exhaust amount from the exhaust ports 56 other than the exhaust port 56 having the second exhaust amount may be smaller than the first exhaust amount. In that case, the exhaust from the exhaust ports 56 other than the exhaust port 56 having the second exhaust amount may be stopped.

However, the exhaust ports 56 are opened to the lower space 52 partitioned with respect to the upper space 51 in which the gate valves 71 are provided, so that the effect on the air flow in the upper space 51 may be small. Therefore, in order to more reliably obtain the effect of suppressing the diffusion of the gas from the processing module 7, it is preferable to change the flow rate of the gas from the gas nozzles 53 or to control the exhaust amount from the exhaust ports 56 while changing the gas flow rate.

Next, a controller 10 shown in FIG. 1 will be described. The controller 10 is a computer, and has a program. The program has a group of steps so that control signals can be outputted to individual components of the substrate processing apparatus 1 and the operations of the individual components can be controlled to transfer and process the wafer W as will be described later. Specifically, the operations of the processing modules 7, such as the operation of the transfer mechanism 22, the operation of the transfer body 61 by the power supplied from the power supply device 60 to each coil 66, the opening/closing of the door valve 28 and the gate valves 29 and 71, the operation of controlling the flow rate of $N_2$ gas by the flow rate controllers 45 and 55, the operation of controlling the exhaust amount by the exhaust amount controllers 47 and 58, and the like are controlled. The program is stored in the controller 10 while being stored in a storage medium such as a hard disk, a CD, a DVD, a memory card, or the like.

Hereinafter, the transfer path of the wafer W in the substrate processing apparatus 1 will be described. The wafer W loaded into the loader module 2 from the transfer container C is transferred to the load-lock module 25 and then to the vacuum transfer module 3. The wafer W is processed in the processing module 7, and then transferred to the vacuum transfer module 3, the load-lock module 25, the loader module 2, and the transfer container C in that order. Specifically, in the case of transferring the wafer W between the vacuum transfer module 3 and the processing modules 7, the wafer W may be transferred to only one of the eight processing modules 7 and processed therein, or the wafer W may be sequentially transferred to the eight processing modules 7 and processed therein.

It is known that the wafer W passes through a vacuum transfer module in which a multi joint arm is disposed on a floor surface thereof in the case of transferring the wafer W between the load-lock module 25 and the processing modules 7. In order to secure the space required for revolving the multi-joint arm, the vacuum transfer module has a housing formed in a quadrilateral shape with relatively large widths in the forward-backward direction and in the left-right direction.

However, the quadrilateral housing has a large inner space and, thus, the footprint (occupied floor area) becomes relatively large. In addition, when a pressure in the quadrilateral housing is set to a vacuum level, the corner portions of the housing are likely to be deformed because a relatively large force is applied to the corner portions of the housing due to ambient air. If the strength of the corner portions is increased to prevent the occurrence of such deformation, the weight of the housing increases. As a result, relatively high costs or large amount of efforts may be required at the time of transporting or assembling the housing. Further, a large metal base is cut in order to manufacture a quadrilateral housing. Since the amount of cutting is relatively large, it may be difficult to reduce manufacturing costs and improve mass productivity.

However, in the case of the vacuum transfer module 3, the transfer body that is magnetically levitated by the magnetic field generating unit 6 moves in the housing 31 to transfer the wafer W, and the housing 31 is formed by the circular tube 33. Hence, the increase in the weight of the housing 31 due to the corner portions can be avoided, and there is no need to reinforce the corner portions. In addition, it is not necessary to increase the widths in the forward-backward direction and in the left-right direction in order to secure the space for revolving the multi joint arm. Accordingly, the increase in the footprint of the vacuum transfer module 3 is suppressed. Further, the increase in the weight is suppressed, which makes it possible to easily handle the housing. Furthermore, a conventional mass-produced tube may be used as the circular tube 33 forming the housing 31, for example. In that case, the costs and efforts for manufacturing the vacuum transfer module 3 can be reduced.

Figure 8:
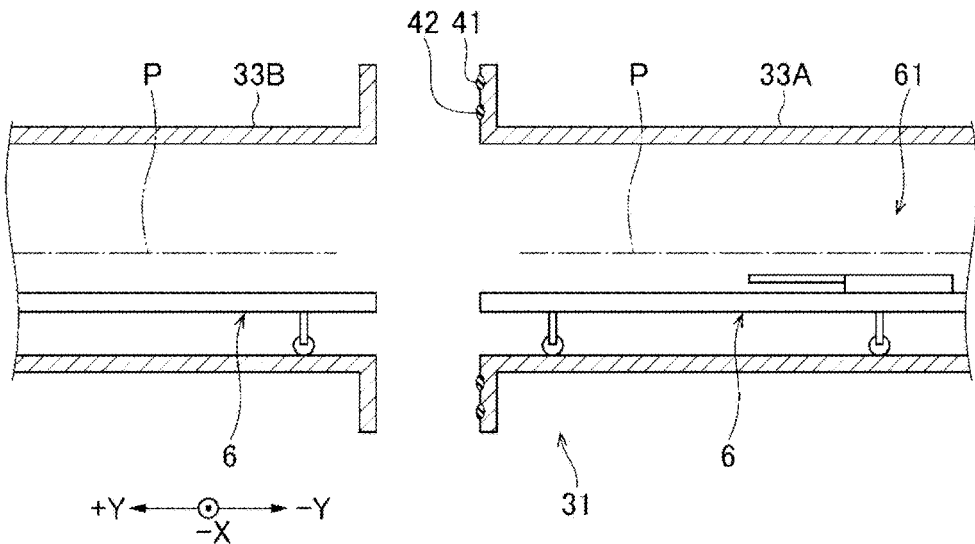
FIG. 8 explains separation of the circular tube.

Next, an example of an operation performed by an operator in the case of unloading the magnetic field generating unit 6 and the transfer body 61 from the housing 31 for maintenance of the magnetic field generating unit 6 and the transfer body 61 will be described. First, the exhaust from the exhaust ports 56 is stopped and N$_2$ gas is supplied from the gas nozzles 53, thereby switching a pressure in the housing 31 from a vacuum pressure to an atmospheric pressure. On the other hand, the magnetic levitation of the transfer body 61 is stopped and the transfer body 61 is landed on the magnetic field generating surface 67. Then, the circular tubes 33A and 33B forming the housing 31 are separated by releasing the connection between the circular tubes 33A and 33B (see FIG. 8).

Figure 9:
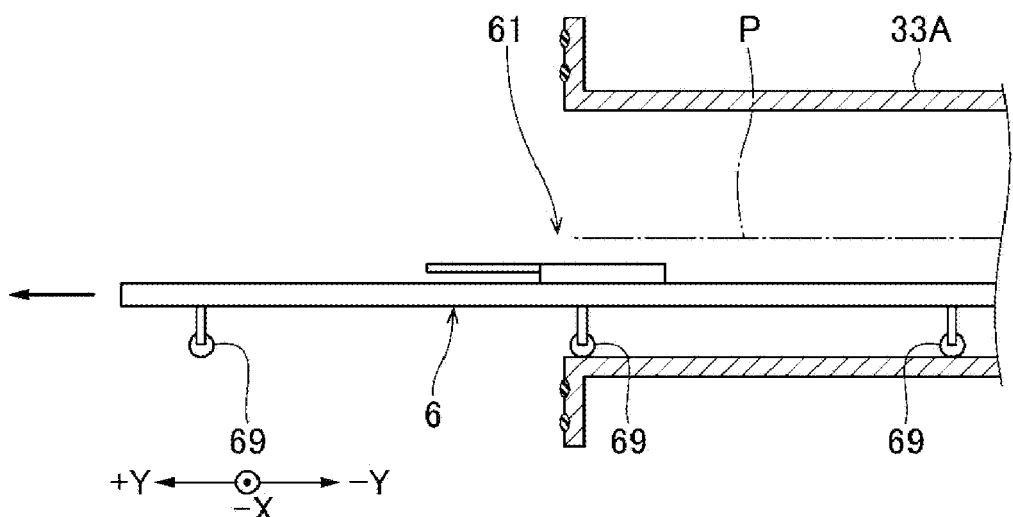
FIG. 9 explains extraction of a magnetic field generating portion from the circular tube.

Next, by pulling the magnetic field generating unit 6 in the axial direction of the circular tube 33A through the tube opening of the circular tube 33A on the flange 36 side, the magnetic field generating unit 6 is unloaded to the outside of the circular tube 33A together with the transfer body 61 (see FIG. 9). When the transfer body 61 is landed on the magnetic field generating surface 67 in the circular tube 33A between the circular tubes 33A and 33B, the transfer body 61 is also unloaded to the outside of the circular tube 33A together with the magnetic field generating unit 6. The unloading of the magnetic field generating unit 6 from the circular tube 33B is performed in the same manner as the unloading from the circular tube 33A except that the magnetic field generating unit 6 is unloaded from the tube opening on the flange 35 side. The unloading of the magnetic field generating unit 6 from the circular tubes 33A and 33B can be performed with a relatively small force because the wheels 69 roll on the inner circumferential surfaces of the circular tubes 33A and 33B. The wheels 69 rotates about the X direction axis as described above, and thus serve as guide members for guiding the relative movement of the magnetic field generating unit 6 along the tube axis P with respect to the circular tubes 33A and 33B.

In the case of storing the magnetic field generating unit 6 and the transfer body 61 again in the circular tubes 33A and 33B after the completion of the maintenance, the operation is performed in the reverse order of the loading operation. In this case as well, the magnetic field generating unit 6 can be moved in the circular tubes 33A and 33B with a relatively small force due to the wheels 69. The magnetic field generating unit 6 can be loaded into and unloaded from the circular tube 33B through the tube opening on the flange 36 side, instead of the tube opening on the flange 35 side, by separating the partition wall 39 from the flange 36. An inspection hole may be appropriately formed on the tube wall of the circular tube 33 so that an operator can check from the outside of the circular tube 33 whether or not the magnetic field generating unit 6 is stored in a predetermined position in the circular tube 33. The inspection hole is closed while the apparatus is being used.

As described above, the circular tubes 33A and 33B forming the housing 31 are separable, and the circular tubes 33A and 33B and the magnetic field generating unit 6 can be attached/detached by relative movement in the tube axis direction through the tube openings of the circular tubes 33A and 33B. Therefore, even if the tube diameters of the circular tubes 33A and 33B are relatively small, the maintenance of the magnetic field generating unit 6 and the transfer body 61 and the fabrication of the vacuum transfer module 3 can be easily performed. Further, since the wheels 69 for guiding such relative movement are provided, the attachment/detachment operation can be easily performed.

The guide member for guiding such relative movement is not limited to a rolling body such as the wheels 69. For example, a guide rail (referred to as "one guide rail") extending along the bottom surface of the floor plate 65 is formed, and a guide rail (referred to as "another guide rail") extending along the tube axis P on the inner circumferential surface of the circular tube 33 is formed. One guide rail and another guide rail may be engaged with each other so that they can slide along the lengthwise direction of the guide rails.

Figure 10:
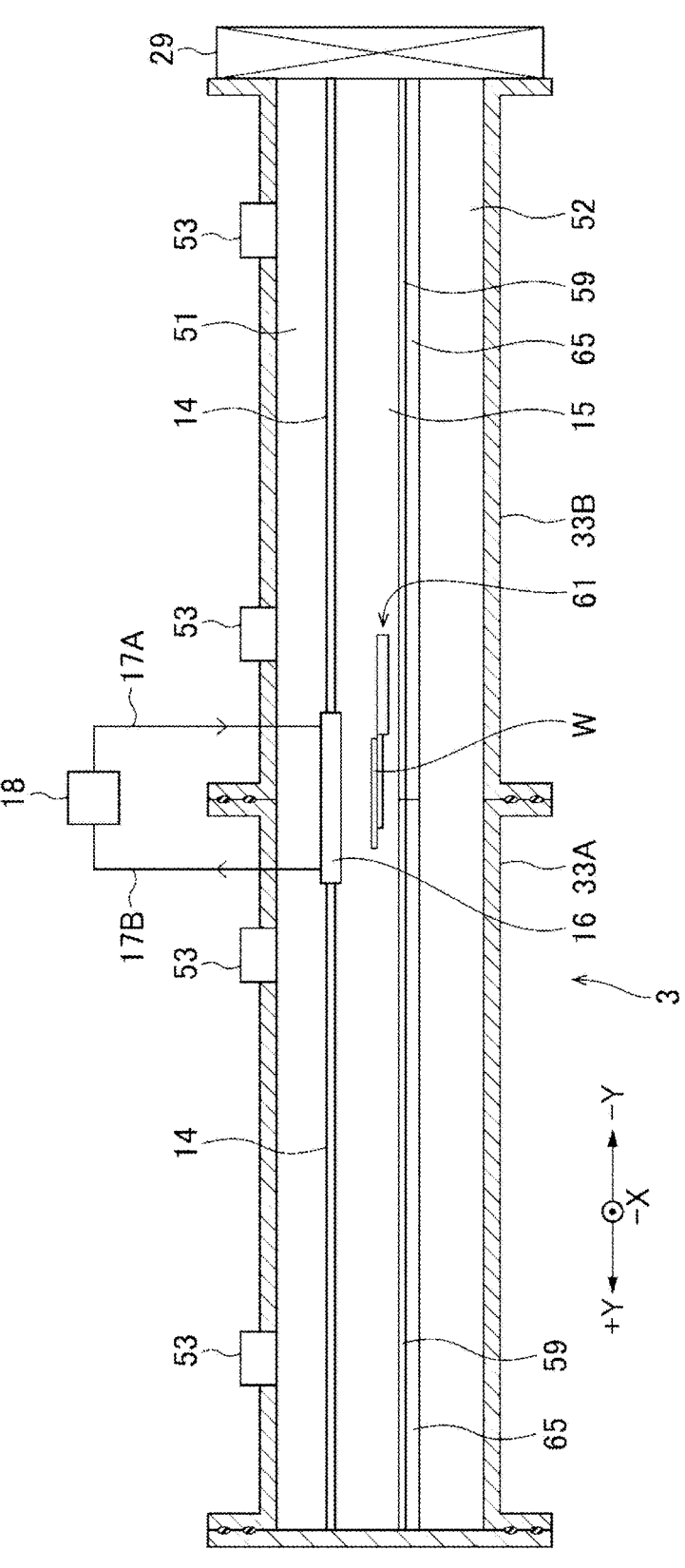
FIG. 10 is a longitudinal cross-sectional view of the vacuum transfer module in the case of providing a temperature control mechanism.

FIG. 10 shows an example in which a cooling device 16 for temperature control is disposed in the upper space 51. The cooling device 16 is formed in a horizontal plate shape, and has a channel for fluid therein. The cooling device 16 is connected to a downstream end of a supply line 17A for supplying fluid to the channel and an upstream end of a discharge line 17B for discharging fluid from the channel. The upstream end of the supply line 17A and the downstream end of the discharge line 17B are connected to a chiller 18 having a pump and a fluid temperature control mechanism. The channels in the chiller 18, the supply line 17A, the discharge line 17B, and the cooling device 16 constituting the temperature controller form a fluid circulation path. The fluid having a preset temperature is supplied to the channel of the cooling device 16, so that a cooling surface 19 that is the bottom surface of the cooling device 16 is set to the preset temperature. The preset temperature is lower than the processing temperature of the wafer W in each processing module 7. The cooling surface 19 is disposed above the magnetic field generating surface 67 to face the magnetic field generating surface 67.

When the transfer body 61 unloads the wafer W from the processing module 7, the transfer body 61 moves to a position where the surface of the wafer W faces the cooling surface 19 with a gap therebetween, as shown in FIG. 10. Accordingly, heat is exchanged between the wafer W and the cooling surface 19. In other words, the wafer W is radiatively cooled by the cooling surface 19. The transfer body 61 stands by for a predetermined period of time at a position where the wafer W faces the cooling surface 19, so that the cooled wafer W is transferred to a next transfer destination (the processing module 7 or the load-lock module 25 for performing next processing). By providing the cooling device 16, it is possible to more reliably prevent the temperature around the vacuum transfer module 3 from increasing.

In the configuration example of the vacuum transfer module 3, the heat shield plate 14 extends in the +Y direction and the −Y direction from the cooling device 16, and the region below the heat shield plate 14 and the cooling device 16 serves as the transfer region 15 for the wafer W. Therefore, unlike the configuration example described with reference to FIG. 2 and the like, in the configuration example shown in FIG. 10, a part of the heat shield plate 14 is replaced with the cooling device 16. Alternatively, the entire heat shield plate 14 may be replaced with the cooling device 16. In other words, the temperature controller 5 may be formed to extend from one end to the other end in the Y direction of the upper space 51 without providing the heat shield plate 14. More specifically, the heat shield plate 14 is made of a material having relatively high thermal reflectivity, such as aluminum, ceramic, or the like. In the example shown in FIG. 10, a heat shield plate 59 is disposed to cover the floor plate 65 from the top. The heat shield plate 59 is made of the same material as that of the heat shield plate 14, so that the upper surface of the heat shield plate 59 has thermal reflectivity higher than that of the upper surface of the floor plate 65. Due to the action of the heat shield plate 59, the radiant heat from the wafer W on the transfer body 61 can be blocked, which makes it possible to more reliably prevent the temperature around the vacuum transfer module 3 from increasing. In this example, the magnetic field is formed on the heat shield plate 59 while transmitting the heat shield plate 59. Therefore, the upper surface of the heat shield plate 59 corresponds to the magnetic field generating surface from which the transfer body 61 floats. Also in the embodiment described with reference to FIG. 1 and the like, the heat shield plate 59 can be provided as in the example of FIG. 10.

The vacuum transfer module 3 may be provided with a cleaning mechanism for removing foreign substances adhered to the inner wall of the housing 31. The cleaning is performed in a state where the housing 31 is maintained in a vacuum atmosphere while the wafer W is not being transferred by the vacuum transfer module 3. The cleaning mechanism may have various configurations to be described below. In the following description, the period in which cleaning is performed may be referred to as "cleaning period" and the period in which cleaning is not performed and the wafer W can be transferred may be referred to as "normal period."

The cleaning mechanism may be a gas supply mechanism for supplying a gas during the cleaning period in a different manner from that in the normal period. Specifically, for example, a line system is configured such that the cleaning gas can be injected, instead of $N_2$ gas, from the gas nozzles 53 during the cleaning period. More specifically, lines that connects the cleaning gas supply source and the gas nozzles 53, and the flow rate controllers 55 disposed in the lines are provided as the gas supply mechanism forming the cleaning mechanism, and the $N_2$ gas and the cleaning gas can be selectively supplied from the gas nozzles 53. The cleaning gas is different from $N_2$ gas. For example, the cleaning gas is highly clean air referred to as "clean dry air." By supplying the cleaning gas to the wall surface of the housing 31, the foreign substances adhered to the wall surface of the housing 31 are peeled off and removed through the exhaust ports 56.

The flow rate of the gas injected during the cleaning period may be greater than the flow rate of the gas injected during the normal period. In the case of injecting $N_2$ gas from the gas nozzles 53 at the first flow rate or the second flow rate during the normal period as described above, the cleaning gas is injected at a third flow rate greater than the first flow rate and the second flow rate from the gas nozzles 53.

The type of gas used in the normal period and the type of gas used in the cleaning period may be the same. In other words, $N_2$ gas may be injected at the third flow rate during the cleaning period. In the case of changing the flow rate of $N_2$ gas between the normal period and the cleaning period, the flow rate controller 55 serves as the gas supply mechanism forming the cleaning mechanism. Further, in the case of switching the gas to be supplied into the housing 31 between $N_2$ gas and the cleaning gas, the gases are injected from the gas nozzles 53 in the above description. However, a dedicated gas nozzle for the cleaning gas may be formed at the housing 13 so that the cleaning gas can be injected from the dedicated gas nozzle.

Figure 11:
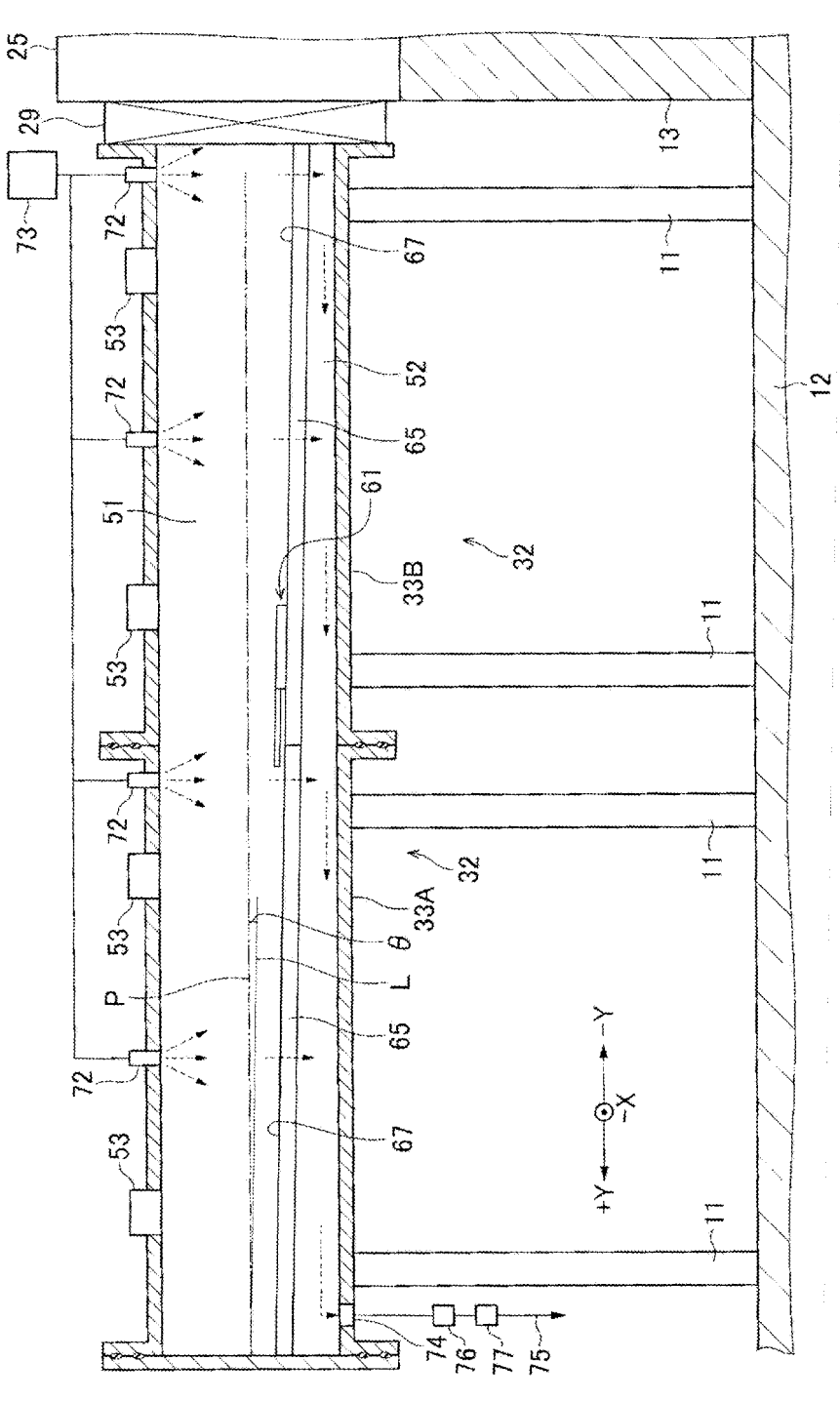
FIG. 11 is a longitudinal cross-sectional view of a vacuum transfer module to which a cleaning liquid supply mechanism is applied.

The cleaning mechanism may supply cleaning liquid into the housing 31. FIG. 11 shows a configuration example of the vacuum transfer module 3 to which the cleaning liquid supply mechanism is applied. Some components such as the exhaust ports 56, the heat shield plate 14, and the like are not illustrated to avoid complicated illustration. For example, a plurality of cleaning liquid nozzles 72 are arranged above the joint circular tube 32 at intervals in the Y direction, and inject cleaning liquid supplied from a cleaning liquid supply source 73. The cleaning liquid nozzles 72 and the cleaning liquid supply source 73 constitute the cleaning mechanism (cleaning liquid supply mechanism). Liquid that is unlikely to volatilize in a vacuum atmosphere is appropriately selected as the cleaning liquid.

The cleaning liquid injected from the cleaning liquid nozzle 72 is supplied to the portion forming the upper space 51 on the inner circumferential surface of the joint circular tube 32 and flows downward along the portion. The cleaning liquid flows to the portion forming the lower space 52 on the inner circumferential surface of the joint circular tube 32 through the communication path 50, and then flows toward the bottom portion of the joint circular tube 32. In this example, the cleaning liquid nozzles 72 are arranged at intervals in the Y direction. The dashed arrows in FIG. 11 indicate the flow of the cleaning liquid.

The joint circular tube 32 shown in FIG. 11 is supported by the columns 11 and inclined such that the +Y side (one end side in the tube axis direction) becomes lower than the −Y side (the other end side in the tube axis direction). Therefore, the tube axis P indicated by the dashed dotted line extends in the lateral direction, but is inclined with respect to a horizontal plane L indicated by the solid line. The inclination of the tube axis P is intended to allow the cleaning liquid on the bottom portion of the joint circular tube 32 to flow along the inner circumferential surface of the joint circular tube 32 toward the +Y side in the case of injecting the cleaning liquid toward a drain port 74 to be described later. The inclination is intentionally formed to allow the cleaning to flow, and can be avoided in manufacturing the apparatus. An angle θ between the tube axis P and the horizontal plane L is set to be greater than or equal to 3° and smaller than or equal to 10°, for example. The magnetic field generating surface 67 of the floor plate 65 is horizontal as in the above-described examples, so that high transfer accuracy of the transfer body 61 can be achieved.

The drain port 74 is opened at the bottom portion on the +Y side of the joint circular tube 32, and a drain line 75 is connected to the drain port 74. Further, valves 76 and 77 are sequentially interposed in the drain line 75 toward the downstream side, and the downstream end of the drain line 75 is connected to a drain passage (not shown) maintained in an atmospheric atmosphere. During the cleaning period, the opening/closing of the valves 76 and 77 is controlled such that only one of them is opened. Hereinafter, the opening/closing of the valves 76 and 77 will be described in detail. First, the valve 77 is closed while the valve 76 is opened, and the cleaning liquid stays in a portion between the valves 76 and 77 in the drain line 75. Then, the valve 76 is closed in a state where the valve 77 is opened, and the cleaning liquid in that portion is discharged to the drain passage.

The cleaning may be performed after the entire housing 31 is filled with the cleaning liquid. During the cleaning period in which the cleaning is performed using the cleaning liquid supply mechanism, the valve constituting the exhaust amount controller 47 is closed to prevent the cleaning liquid from being supplied to the exhaust mechanism 48 that is a vacuum pump through the exhaust port 56. Further, the injection of $N_2$ gas from the gas nozzles 53 is also stopped.

In the vacuum transfer module 3 in which the cleaning liquid supply mechanism is applied as a cleaning mechanism, the housing 31 is formed by the circular tube 33, so that the cleaning liquid supplied to the inner circumferential surface of the circular tube 33 flows due to its own weight to the bottom portion of the housing 31 where the drain port 74 is opened along the inner circumferential surface of the circular tube 33. Therefore, it is possible to quickly remove the cleaning liquid from the housing 31 after the cleaning is completed. Further, as described above, in the example shown in FIG. 11, the joint circular tube 32 is disposed such that the tube axis P is inclined. Hence, the cleaning liquid flows toward the drain port 74 and is removed, so that the cleaning liquid can be removed more quickly.

A mechanism for ultrasonically vibrating the housing 31 may be provided as the cleaning mechanism. The ultrasonic vibration mechanism includes a vibrator and an oscillator that supplies a power to the vibrator. The vibrator is disposed outside the housing 31 or at the columns 11 supporting the housing 31 to vibrate the housing 31 during the cleaning period. The foreign substances adhered to the inner wall surface of the housing 31 are peeled off therefrom due to the vibration, and flow into the exhaust port 56 by the exhaust flow in the housing 31 to be removed. It is also possible to use both the cleaning performed by the ultrasonic vibration mechanism and the cleaning performed by the gas supply mechanism or the cleaning liquid supply mechanism.

Figure 12:
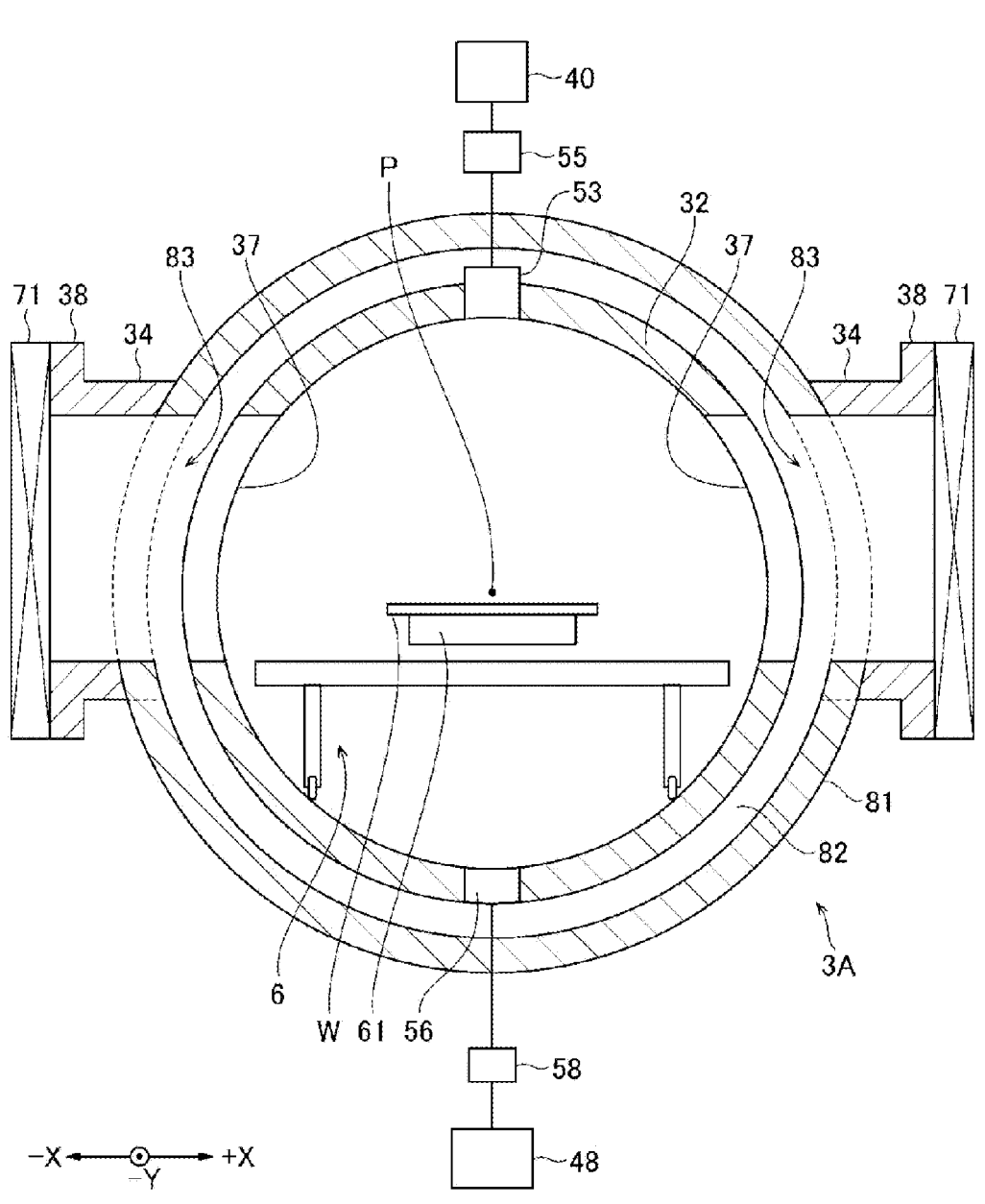
FIG. 12 is a longitudinal cross-sectional view of the vacuum transfer module having a double tube structure.

Next, the differences between the vacuum transfer module 3 and a vacuum transfer module 3A that is a modification of the vacuum transfer module 3 will be mainly described with reference to the longitudinal cross-sectional view of FIG. 12. An outer tube 81 that is a circular tube is disposed to surround the joint circular tube 32 of the vacuum transfer module 3A. The length of the outer tube 81 is greater than that of the joint circular tube 32. The tube axis of the outer tube 81 coincides with the tube axis P of the joint circular tube 32. Therefore, the outer tube 81 and the joint circular tube 32 form a double tube, and the joint circular tube 32 serves as an inner tube. More specifically, the tube axis of the outer tube 81 overlaps the tube axis P. In other words, the outer tube 81 and the joint circular tube 32 are coaxial.

The joint circular tube 32 has the same inner configuration as that of the vacuum module 3, so that the magnetic field generating unit 6 is disposed inside the joint circular tube 32. The inner circumferential surface of the outer tube 81 and the outer circumferential surface of the joint circular tube 32 are separated from each other with a cylindrical gap 82 interposed therebetween. Although not shown, the joint circular tube 32 is locally supported on the inner circumferential surface of the outer tube 81 via support members. One end of the outer tube 81 in the axial direction is connected to the load-lock module 25, and the opening of the other end in the axial direction of the outer tube 81 is closed by a partition wall (not shown) so that the gap 82 becomes a sealed space. Therefore, in this example, the circular tube includes the outer tube 81 and the joint circular tube 32, and the outer tube 81 and the partition wall that closes the end of the outer tube constitute the housing of the vacuum transfer module 3A.

Openings 83 are opened on the sidewall of the outer tube 81 to overlap the openings 37 of the joint circular tube 32. The side tubes 34 are disposed, instead of the joint circular tube 32, on the outer circumferential surface of the outer tube 81 and extend from the periphery of the openings 83 in the X direction. The flanges 38 at the ends of the side tubes 34 are connected to the gate valves 71, similarly to the flanges 38 in the vacuum transfer module 3. With this configuration, the gap 82 is also maintained in a vacuum atmosphere by exhausting the joint circular tube 32.

In the vacuum transfer module 3A, even if the joint circular tube 32 is heated by the radiant heat from the wafer W unloaded from the processing module 7, the heating of the outer tube 81 via the joint circular tube 32 is suppressed because the joint circular tube 32 and the outer tube 81 are in local contact with each other as described above and the gap 82 provides a vacuum insulation effect. Therefore, in the vacuum transfer module 3A, an increase in an ambient temperature is suppressed. Although the vacuum transfer module 3A illustrated in FIG. 12 is not provided with the heat shield plate 14 and the cooling device 16 for suppressing an increase in an ambient temperature outside the module, they may be provided to further suppress an increase in an ambient temperature.

Since the outer tube 81 is formed as a circular tube similarly to the joint circular tube 32, the vacuum transfer module 3A also exhibits the effect obtained when the housing does not have corner portions, which has been described in the case of the vacuum transfer module 3.

Figure 13:
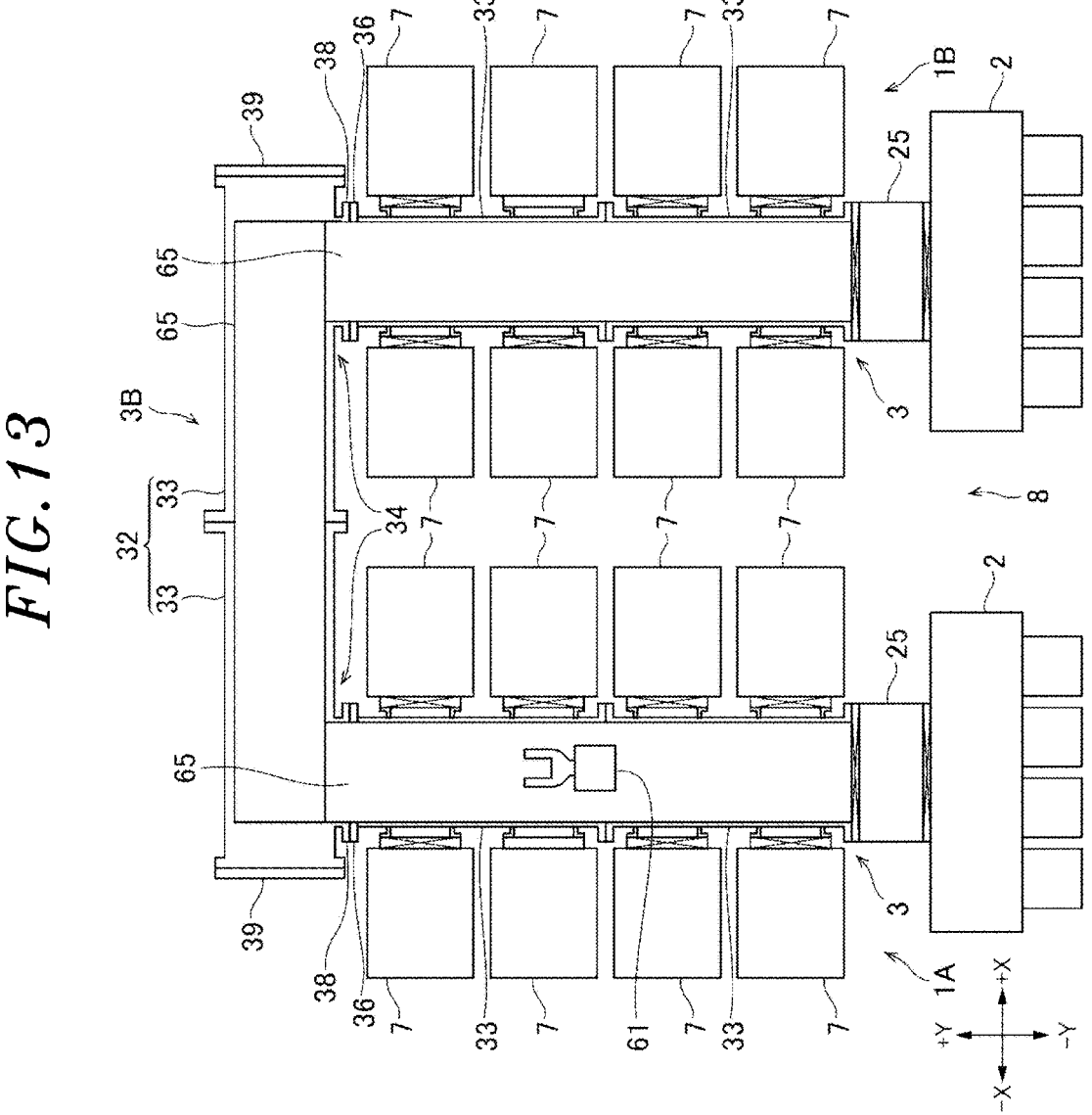
FIG. 13 is a plan view showing a configuration example in which the substrate processing apparatuses are connected to each other.

Next, a substrate processing apparatus 8 shown in FIG. 13 will be described. In the substrate processing apparatus 8, two substrate processing apparatuses 1 described above are arranged side by side in the X direction. The vacuum transfer modules 3 of the two substrate processing apparatuses 1 are connected to each other through a vacuum transfer module 3B having the same configuration as that of the vacuum transfer module 3. The two substrate processing apparatuses 1 will be referred to as "substrate processing apparatus 1A" and "substrate processing apparatus 1B" for convenience.

The vacuum transfer module 3B and the vacuum transfer module 3 are different in that both ends of the joint circular tube 32 extend in the X direction, and the tube openings that are opened in the X direction are blocked by the partition walls 39. Two side tubes 34 are spaced apart from each other in the X direction and directed toward the +Y side.

In the vacuum transfer modules 3 of the substrate processing apparatuses 1A and 1B, the flanges 36 on the +Y side are not provided with the partition walls 39, and connected to the flanges 38 of the side tubes 34 of the vacuum transfer module 3B. Further, the floor plates 65 of the substrate processing apparatuses 1A and 1B extend into the housing 31 of the vacuum transfer module 3B and connected to the floor plate 65 of the vacuum transfer module 3B. Since the floor plates 65 are connected, the transfer body 61 can move between the housing 31 of the substrate processing apparatus 1A and the housing 31 of the substrate processing apparatus 1B via the vacuum transfer module 3B. Therefore, the substrate processing apparatus 8 is not required to transfer the wafer W to the atmospheric atmosphere in the case of sequentially transferring and processing the wafer W between the processing modules 7 of the substrate processing apparatus 1A and the processing modules 7 of the substrate processing apparatus 1B.

Although the case in which a conventional circular tube can be as the circular tube 33 of the substrate processing apparatus 1 (1A and 1B) has been described, it is possible to use a conventional circular tube that complies with a predetermined standard. Therefore, in the vacuum transfer module 3A, the flanges 38 of the side tubes 34 connected to the circular tube 33 may be flanges that comply with the corresponding standard. Therefore, the fabrication of the vacuum transfer module 3B can be facilitated. In other words, since the housing 31 of the vacuum transfer module 3 is formed by the circular tube 33, it is possible to facilitate the fabrication of not only the housing 31 but also the modules connected thereto. Hence, the fabrication of the apparatus in which the apparatuses including the vacuum transfer modules 3 are connected to each other as illustrated in FIG. 13 can also be facilitated.

Although the case in which the circular tube 32 forming the housing 31 includes the two circular tubes 33A and 33B connected in the tube axis directions was illustrated, the housing 31 may be formed by a single circular tube, or may be formed by connecting three or more circular tubes in the tube axis direction. When a plurality of circular tubes are joined as in the case of the joint circular tube 32, the joined circular tube may be considered as one circular tube. Therefore, one side tube 34 (substrate transfer path) is disposed at each of the circular tubes 33A and 33B forming the joint circular tube 32. In that case, the circular tube has not a single but multiple substrate transfer paths, and the multiple transfer paths are formed at different positions in the tube axis direction.

Figure 14:
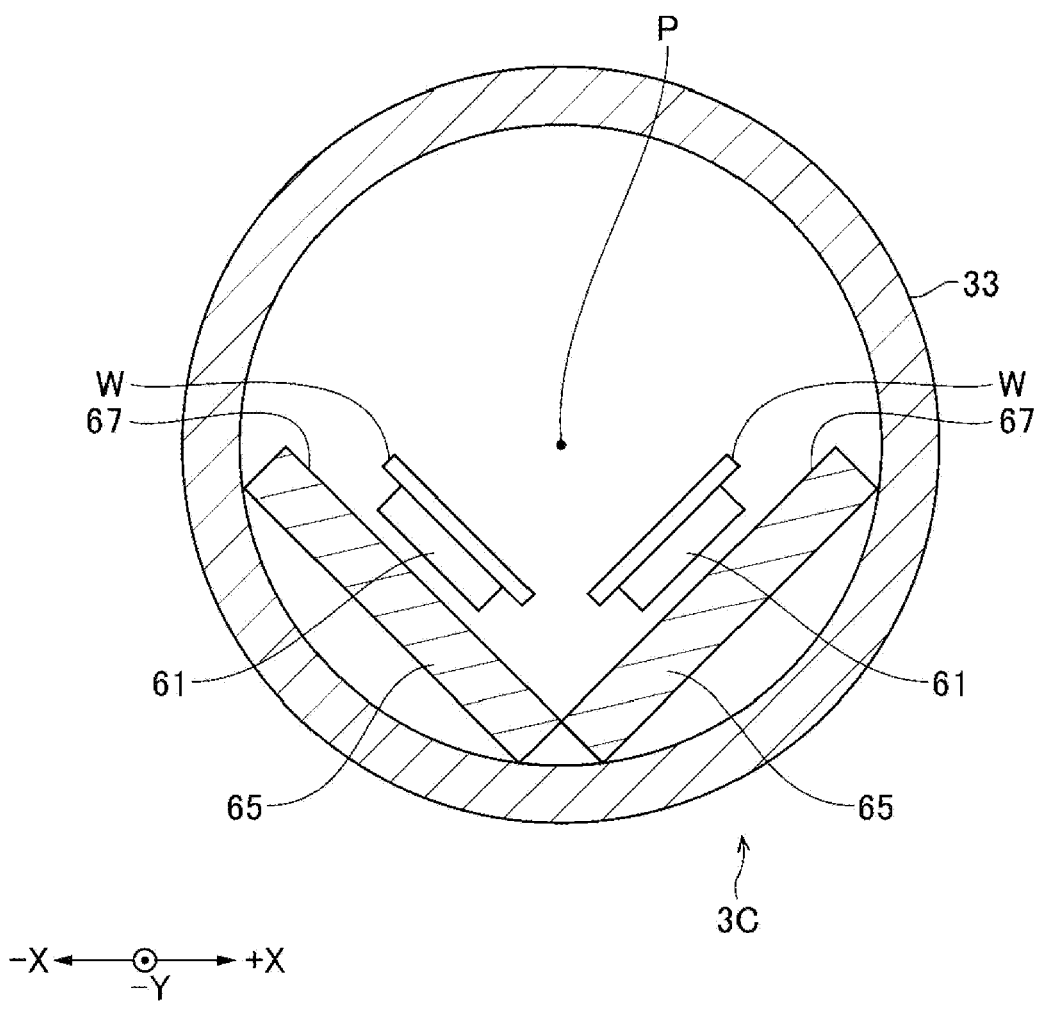
FIG. 14 is a longitudinal cross-sectional view of a vacuum transfer module having different magnetic field generating surfaces.

Next, a vacuum transfer module 3C shown in FIG. 14 will be described. The vacuum transfer module 3C is different from the vacuum transfer module 3 in that two floor plates 65 are disposed at one circular tube 33, and the two floor plates 65 are arranged in a V shape when viewed in the axial direction. More specifically, the magnetic field generating surface 67 of one of the two floor plates 65 rises from the center of the circular tube 33 toward the left side when viewed in the tube axis direction, and the magnetic field generating surface 67 of the other floor plate 65 rises from the center of the circular tube 33 toward the right side when viewed in the tube axis direction. The two magnetic field generating surfaces 67 are inclined in different directions with respect to the horizontal plane and form a first inclined surface and a second inclined surface, respectively.

The transfer body 61 is provided for each magnetic field generating surface 67. In other words, two transfer bodies 61 move in a floating state in the plane direction with respect to the magnetic field generating surface 67 forming the first inclined surface and the magnetic field generating surface 67 forming the second inclined surface. In the vacuum transfer module 3C, the power is supplied such that some of the coils 66 of the floor plate 65 exert a repulsive action on the magnets 64 of the transfer bodies 61, and some other coils exert an attracting action on the magnets 64 of the transfer bodies 61. By maintaining the balance between the repulsive action and the attracting action, the transfer bodies 61 can move in the plane direction of the magnetic field generating surfaces 67 while being spaced apart from the magnetic field generating surfaces 67 that are inclined surfaces. The magnetic field generating surfaces 67 are inclined to a degree that prevents the wafers W from falling off the transfer bodies 61. With this configuration, the transfer operations can be performed simultaneously using the two transfer bodies 61 (the first transfer body and the second transfer body), thereby improving the throughput while avoiding scaling up of the circular tube 33.

Figure 15:
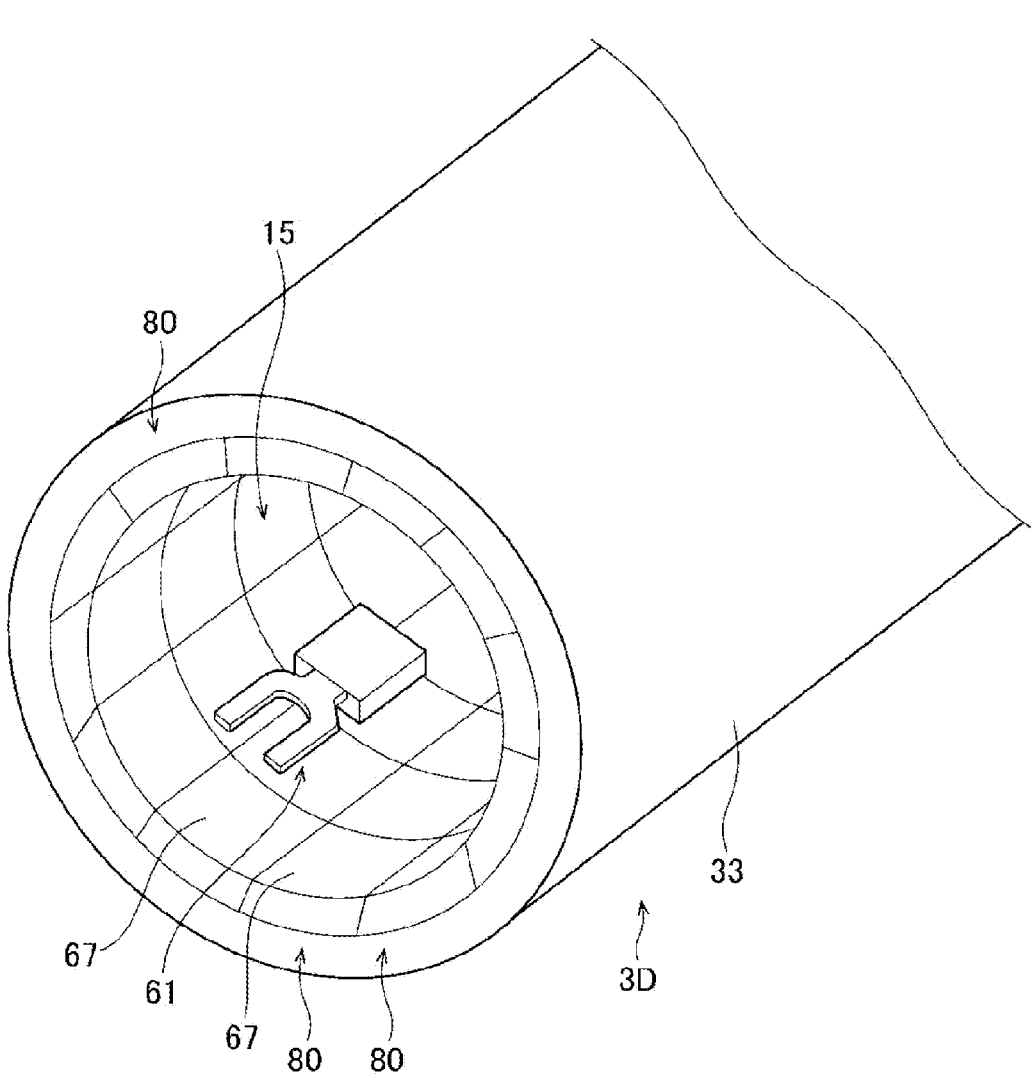
FIG. 15 is a perspective view of a vacuum transfer module having a magnetic field generating surface forming a circular tube.

Next, a vacuum transfer module 3D shown in FIG. 15 will be described. In this example, a plurality of magnetic field generating plates 80 forming the floor plate 65 are arranged to cover the inner circumferential surface of the circular tube 33. The magnetic field generating surfaces 67 of the magnetic field generating plates 80 face the tube axis P. By providing the magnetic field generating plates 80 as described above, the magnetic field generating surfaces 67 of the magnetic field generating plates 80 are formed as curved surfaces. The magnetic field generating surfaces 67 are entirely formed in a circular tube shape, and the region on the inner surface of the circular tube serves as the transfer region 15 for the wafer W. In other words, the transfer region 15 is also formed in a circular tubular shape. Further, by providing the magnetic field generating plates 80 as described above, the inner circumferential surface of the circular tube including the circular tube 33 and the magnetic field generating plates 80 serves as the magnetic field generating surface 67.

Also in the vacuum transfer module 3D, the balance between the repulsive action and the attracting action is maintained, so that the transfer body 61 can move in the plane direction of the magnetic field generating surface 67 while being separated from the magnetic field generating surface 67. In other words, the transfer body 61 can move both in the circumferential direction and in the axial direction on the magnetic field generating surface 67 forming the circular tube. Although only one transfer body 61 is shown in FIG. 15, a plurality of transfer bodies 61 may be provided and moved without interference with each other. The transfer body 61 supporting the wafer W moves in a state where the supporting surface of the wafer W faces upward to prevent the wafer W from falling. On the other hand, the transfer body 61 that is not supporting the wafer W may move in a state where the support surface faces upward or downward or sideward. The circular tube 33 may not be provided in the vacuum transfer module 3D. In other words, only the magnetic field generating plate 80 may form the circular tube.

In the apparatus such as the substrate processing apparatus 1 or the like, the transfer body 61 moves in the housing 31 maintained in a vacuum atmosphere. However, the transfer body 61 may move in the housing 31 maintained in an atmospheric atmosphere. When the housing 31 is maintained in an atmospheric atmosphere, the processing module 7 connected to the housing 31 and to which the wafer W is delivered by the transfer body 61 may also be maintained in an atmospheric atmosphere. The substrate as a transfer target of the present disclosure is not limited to a circular substrate, and may be a rectangular substrate. Further, the configuration in which the circular tube forming the housing 31 has a tube wall having a perfect circular shape when viewed in the tube axis direction has been illustrated, a tube may have an elliptical shape. In addition, although the case of supplying N$_2$ gas into the housing 31 has been described, the present disclosure is not limited thereto, and any other inert gas such as argon or the like can also be used.

The embodiments of the present disclosure are considered to be illustrative in all respects and not restrictive. The above-described embodiments may be omitted, replaced, changed and/or combined in various forms without departing from the scope of the appended claims and the gist thereof.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A substrate transfer apparatus comprising:
a circular tube having a tube axis extending in a lateral direction and having a transfer region for a substrate in the circular tube;
a magnetic field generating portion having a magnetic field generating surface facing the transfer region and configured to generate a magnetic field on the magnetic field generating surface;
a transfer body configured to transfer the substrate while moving in a plane direction of the magnetic field generating surface in a state that the transfer body is distant from the magnetic field generating surface by the magnetic field; and
a guide member configured to guide the relative movement of the magnetic field generating portion along the tube axis with respect to the circular tube to attach and detach the magnetic field generating portion to and from the circular tube through a tube opening of the circular tube,
wherein the movement of the transfer body, by the magnetic field, in the plane direction of the magnetic field generating surface includes movement in the lateral direction and movement in a longitudinal direction orthogonal to the lateral direction.

2. The substrate transfer apparatus of claim 1, wherein the circular tube forms a part of a housing having a sealed space therein, and
the housing is provided with an exhaust port that evacuates the sealed space to form a vacuum atmosphere.

3. The substrate transfer apparatus of claim 2, wherein the magnetic field generating portion partitions an inner space of the circular tube into a lower space and an upper space including the transfer region,
the exhaust port is opened to the lower space in the circular tube,
a communication channel is provided to allow the upper space and the lower space to communicate with each other, and
one or more first gas supply ports configured to supply a first gas to the upper space are provided to form air flow from the upper space toward the lower space.

4. The substrate transfer apparatus of claim 3, wherein the supply of the first gas and an exhaust of the first gas from the exhaust port are performed such that a pressure in the upper space becomes higher than a pressure in the lower space.

5. The substrate transfer apparatus of claim 3, wherein a plurality of the first gas supply ports are arranged at different positions in the axial direction of the circular tube,
transfer paths for the wafer, which are opened and closed by a plurality of valves, are opened at different positions in a tube axis direction of the circular tube on a side surface of the circular tube, and
a first gas supply device is provided to supply the first gas to the plurality of the first gas supply ports such that a flow rate of the first gas from a first gas supply port among the plurality of the first gas supply ports that corresponds to an opened valve among the valves becomes greater than a flow rate of the first gas from a first gas supply port corresponding to a closed valve.

6. The substrate transfer apparatus of claim 1, wherein the circular tube includes a first circular tube having a first flange at an end thereof and a second circular tube having a second flange at an end thereof,
the first flange and the second flange face each other,
a first seal member and a second seal member are provided to be in close contact with the first flange and the second flange, and are formed in an annular shape along a tube opening of the first circular tube and a tube opening of the second circular tube, and
an air flow forming device is provided to form air flow along a circumference of a gap between the first seal member and the second seal member by supplying a second gas to the gap.

7. The substrate transfer apparatus of claim 1, wherein the circular tube is a double tube including an inner tube and an outer tube having an inner circumferential surface separated from an outer circumferential surface of the inner tube and surrounding the inner tube, and
the magnetic field generating portion is disposed in the inner tube, and a vacuum atmosphere is generated between the inner tube and the outer tube.

8. The substrate transfer apparatus of claim 1, further comprising:
a heat shield member disposed on the opposite side of the magnetic field generating surface with respect to the transfer region in the circular tube,
wherein the heat shield member is configured to block radiant heat from the substrate supported by the transfer body to a tube wall of the circular tube.

9. The substrate transfer apparatus of claim 1, further comprising:
a cooling device disposed to face the substrate supported by the transfer body and having a temperature controlled by a temperature controller to cool the substrate,
wherein the cooling device is disposed on the opposite side of the magnetic field generating surface with respect to the transfer region in the circular tube.

10. The substrate transfer apparatus of claim 1, wherein the circular tube forms a part of a housing having a sealed space therein,
the housing is provided with an exhaust port that evacuates the sealed space to form a vacuum atmosphere, and
a cleaning mechanism is provided to clean the housing maintained in a vacuum atmosphere.

11. The substrate transfer apparatus of claim 10, wherein the cleaning mechanism includes a gas supply mechanism configured to supply a gas into the housing at a flow rate greater than a flow rate of a gas supplied during the transfer of the substrate, or supply a gas different from a gas supplied during the transfer of the substrate.

12. The substrate transfer apparatus of claim 10, wherein the cleaning mechanism is a cleaning liquid supply mechanism configured to supply cleaning liquid into the housing.

13. The substrate transfer apparatus of claim 12, wherein the circular tube is inclined such that one end in the tube axis direction becomes lower than the other end, and a drain port through which the cleaning liquid is discharged is formed at a bottom portion of the circular tube on said one end side.

14. The substrate transfer apparatus of claim 10, wherein the cleaning mechanism includes a vibration mechanism configured to vibrate the housing.

15. The substrate transfer apparatus of claim 1, wherein the magnetic field generating surface has a first inclined surface rising from a center of the circular tube toward a left side or a right side and a second inclined surface rising from the center of the circular tube toward the other side when viewed in the tube axis direction, and the transfer body includes a first transfer body moving in a plane direction of the first inclined surface, and a second transfer body moving in a plane direction of the second inclined surface.

16. The substrate transfer apparatus of claim 1, wherein the magnetic field generating surface forms an inner circumferential surface of the circular tube.

17. A substrate transfer method comprising:

generating a magnetic field on a magnetic field generating surface facing a transfer region for a substrate, in a magnetic field generating portion disposed in a circular tube that extends in a lateral direction and have therein the transfer region;

transferring the substrate by moving a transfer body in a plane direction of the magnetic field generating surface in a state that the transfer body is distant from the magnetic field generating surface by the magnetic field; and guiding the relative movement of the magnetic field generating portion by a guide member along the tube axis with respect to the circular tube to attach and detach the magnetic field generating portion to and from the circular tube through a tube opening of the circular tube, wherein the movement of the transfer body, by the magnetic field, in the plane direction of the magnetic field generating surface includes movement in the lateral direction and movement in a longitudinal direction orthogonal to the lateral direction.

* * * * *